(12) United States Patent
Antoniolli et al.

(10) Patent No.: US 12,400,891 B2
(45) Date of Patent: Aug. 26, 2025

(54) DEPOSITION APPARATUS, METHOD OF DEPOSITION ON A SUBSTRATE, SUBSTRATE STRUCTURE AND SUBSTRATE SUPPORT

(71) Applicant: APPLIED MATERIALS ITALIA S.R.L., San Biagio di Callalta (IT)

(72) Inventors: Francesca Antoniolli, Oderzo (IT); Marco D'Acunzo, Quinto Di Treviso (IT); Marco Galiazzo, Quinto Di Treviso (IT); Daniel Hada, Cupertino, CA (US)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 985 days.

(21) Appl. No.: 17/440,149

(22) PCT Filed: Mar. 19, 2019

(86) PCT No.: PCT/EP2019/056836
§ 371 (c)(1),
(2) Date: Sep. 16, 2021

(87) PCT Pub. No.: WO2020/187399
PCT Pub. Date: Sep. 24, 2020

(65) Prior Publication Data
US 2022/0157629 A1    May 19, 2022

(51) Int. Cl.
*H01L 21/677* (2006.01)
*C23C 14/04* (2006.01)
(Continued)

(52) U.S. Cl.
CPC ...... *H01L 21/67712* (2013.01); *C23C 14/042* (2013.01); *C23C 14/50* (2013.01);
(Continued)

(58) Field of Classification Search
CPC ..... C23C 14/042; C23C 14/50; H01L 21/027; H05K 3/1216; H05K 3/184; H05K 2203/1518
See application file for complete search history.

(56) References Cited

U.S. PATENT DOCUMENTS 6,156,967 A    12/2000  Ralph et al.
6,232,655 B1 *  5/2001  Sugimura ............ H01L 23/482
                                                  257/E23.012
(Continued)

FOREIGN PATENT DOCUMENTS

CN    106435477 A    2/2017
CN    109055898 A    12/2018
(Continued)

OTHER PUBLICATIONS

Japanese Office Action dated Oct. 25, 2022 for Application No. 2021-555611.
(Continued)

*Primary Examiner* — Michael G Miller
(74) *Attorney, Agent, or Firm* — Patterson + Sheridan, LLP

(57) ABSTRACT

A deposition apparatus includes a first substrate support for supporting a substrate in a substantially vertical orientation. The substrate has a first main surface, a second main surface opposite the first main surface and a side surface between the first main surface and the second main surface. The deposition apparatus includes a first deposition device for depositing a first conductive pattern or a first resist mask on the side surface of the substrate while the substrate is supported in the substantially vertical orientation by the first substrate support.

9 Claims, 14 Drawing Sheets

(51) Int. Cl.
  *C23C 14/50* (2006.01)
  *H01L 21/027* (2006.01)
  *H01L 21/768* (2006.01)
  *H05K 3/12* (2006.01)
  *H05K 3/18* (2006.01)

(52) U.S. Cl.
  CPC .......... *H01L 21/027* (2013.01); *H01L 21/768* (2013.01); *H05K 3/1216* (2013.01); *H05K 3/184* (2013.01); *H05K 2203/1518* (2013.01)

(56) References Cited

U.S. PATENT DOCUMENTS

| | | |
|---|---|---|
| 2005/0168960 A1 | 8/2005 | Asahi et al. |
| 2010/0182375 A1 | 7/2010 | Ciampini et al. |
| 2012/0064728 A1* | 3/2012 | Yi .......................... C23C 14/50 438/758 |
| 2017/0244070 A1 | 8/2017 | Bangert et al. |
| 2017/0347461 A1 | 11/2017 | Zwiers et al. |
| 2018/0166324 A1* | 6/2018 | Schaeffer ............ H01L 29/0804 |
| 2019/0078211 A1* | 3/2019 | Kuenle ............... C23C 16/4584 |

FOREIGN PATENT DOCUMENTS

| | | |
|---|---|---|
| EP | 2104147 A1 | 9/2009 |
| JP | S55117185 A | 9/1980 |
| JP | S58058796 A | 4/1983 |
| JP | S58219751 A | 12/1983 |
| JP | S59149086 A | 8/1984 |
| JP | H0521302 A | 1/1993 |
| JP | H05301334 A | 11/1993 |
| JP | H07134559 A | 5/1995 |
| JP | H09115958 A | 5/1997 |
| JP | H10199887 A | 7/1998 |
| KR | 20130045200 A | 5/2013 |
| TW | 201827641 A | 8/2018 |
| WO | 2010044257 A1 | 4/2010 |
| WO | 2018197007 A1 | 11/2018 |

OTHER PUBLICATIONS

Taiwan Office Action issued to Application No. 109107897 on Nov. 18, 2021.

International Search Report, PCT/EP2019/056836, Nov. 14, 2019.

Taiwan Office Action dated Dec. 2, 2022 for Application No. 109107897.

Chinese Office Action dated Nov. 24, 2023 for Application No. 201980094304.X.

Korean Office Action dated Dec. 28, 2023 for Application No. 10-2021-7033603.

* cited by examiner

10

DEPOSITION APPARATUS, METHOD OF DEPOSITION ON A SUBSTRATE, SUBSTRATE STRUCTURE AND SUBSTRATE SUPPORT

FIELD

Embodiments of the present disclosure relate to a deposition apparatus and a method for depositing a material on a substrate, more specifically for depositing a conductive pattern or a mask on a substrate. More specifically, embodiments of the present disclosure relate to a printing apparatus, such as a screen printing apparatus, for printing a material on a substrate.

BACKGROUND

Many technological applications involve the deposition of a material on various kinds of substrates. For example, a substrate may be a substrate used in display technology, a semiconductor substrate, or a printed circuit board substrate. A substrate may be an inflexible substrate such as glass substrate, or a flexible substrate. A substrate may have a variety of possible dimensions, ranging from smartwatch dimension to large area substrates for display manufacturing.

A layer of material can be deposited on a substrate, wherein the deposited layer forms a pattern of deposited material. Several deposition techniques can be used to deposit a pattern on a substrate, such as screen printing, physical vapor deposition or chemical vapor deposition. In some implementations, a patterned layer is formed by using a mask covering a portion of the substrate.

Several applications involve substrates on which conductive patterns are deposited. Such conductive patterns may include conductive materials deposited on different regions of the substrate. Conductive patterns may include a plurality of conductive portions having different shapes and sizes. Some conductive portions of a pattern may be connected to other conductive portions of the pattern by yet further conductive portions, which can result in conductive patterns having a complex structure.

In light of the above, there is a need for improving the deposition of patterned structures on substrates.

SUMMARY

According to an embodiment, a deposition apparatus is provided. The deposition apparatus includes a first substrate support for supporting a substrate in a substantially vertical orientation. The substrate has a first main surface, a second main surface opposite the first main surface and a side surface between the first main surface and the second main surface. The deposition apparatus includes a first deposition device for depositing a first conductive pattern or a first resist mask on the side surface of the substrate while the substrate is supported in the substantially vertical orientation by the first substrate support.

According to a further embodiment, a deposition apparatus is provided. The deposition apparatus includes a first printing device. The deposition apparatus includes a first orientation-changing device downstream of the first printing device. The deposition apparatus includes a second printing device downstream of the first orientation-changing device. The deposition apparatus includes a second orientation-changing device downstream of the second printing device. The deposition apparatus includes a third printing device downstream of the second orientation-changing device.

According to a further embodiment, a method of deposition on a substrate is provided. The method includes providing a substrate in a substantially vertical orientation. The substrate has a first main surface, a second main surface opposite the first main surface and a side surface between the first main surface and the second main surface. The method includes depositing a first conductive pattern or a first resist mask on the side surface of the substrate while the substrate is in the substantially vertical orientation.

According to a further embodiment, a substrate structure is provided. The substrate structure includes a substrate having a first surface, a second surface opposite the first surface and a side surface between the first surface and the second surface. The substrate structure includes a plurality of electrical connections connecting the first surface with the second surface. Each electrical connection includes a conductive line on the first surface, a conductive line on the side surface, and a conductive line on the second surface. The conductive line on the side surface contacts the conductive line on the first surface and the conductive line on the second surface.

According to a further embodiment, a substrate structure is provided. The substrate structure includes a substrate having a first surface, a second surface opposite the first surface and a side surface between the first surface and the second surface. The substrate surface includes a resist mask. The resist mask includes a first resist mask portion covering a portion of the side surface, the first resist mask portion having a first plurality of line-like openings. The resist mask includes a second resist mask portion covering a portion of the first surface, the second resist mask portion having a second plurality of line-like openings. The resist mask includes a third resist mask portion covering a portion of the second surface, the third resist mask portion having a third plurality of line-like openings. Each line-like opening of the first plurality of line-like openings is adjacent to a line-like opening of the second plurality of line-like openings and to a line-like opening of the third plurality of line-like openings.

According to a further embodiment, a substrate support for supporting a substrate in a substantially vertical orientation is provided. The substrate support includes a first surface, the first surface being a stationary surface which is substantially vertical or a movable surface which is movable between a first position and a second position, wherein in the second position the first surface is substantially vertical. The substrate support includes a substrate attraction device adjacent to the first surface.

According to a further embodiment, a substrate support for a deposition apparatus is provided. The substrate support includes a housing comprising a slit to receive a substrate in a substantially vertical orientation.

According to a further embodiment, a substrate support is provided. The substrate support includes a first surface, the first surface being a stationary surface which is substantially vertical or a movable surface which is movable between a first position and a second position, wherein in the second position the first surface is substantially vertical. The substrate support includes a biasing device for biasing a substrate against the first surface, the substrate having a first main surface, a second main surface opposite the first main surface and a side surface between the first main surface and the second main surface. The substrate support is configured for holding the substrate in a substantially vertical orientation in a manner such that the side surface of the substrate is exposed for deposition of a material on the side surface.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
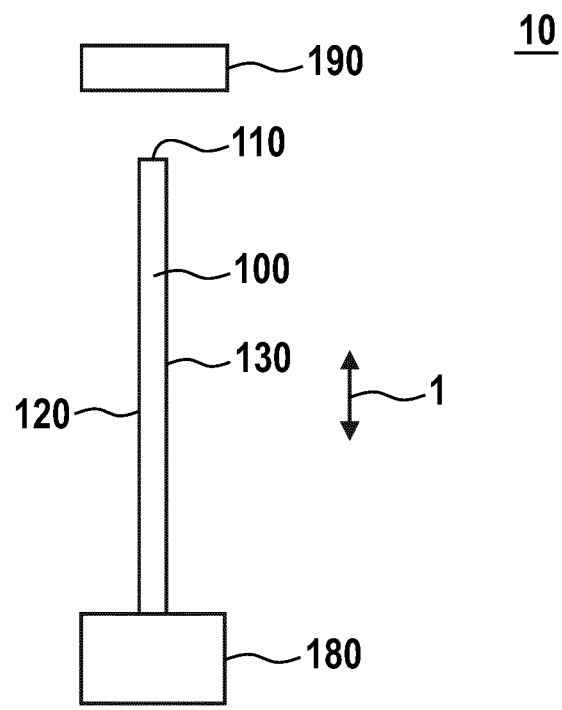
FIG. 1 shows a side view of a deposition apparatus according to embodiments described herein.

FIG. 1 shows a side view of a deposition apparatus 10 according to embodiments described herein.

According to an embodiment, a deposition apparatus 10 is provided. The deposition apparatus 10 includes a first substrate support 180. The first substrate support 180 may be for supporting a substrate 100 in a substantially vertical orientation. The vertical direction is indicated in FIG. 1 by the arrow 1. The substrate 100 has a first main surface 120, a second main surface 130 opposite the first main surface 120 and a side surface 110 between the first main surface 120 and the second main surface 130. The deposition apparatus 10 includes a first deposition device 190. The first deposition device 190 may be for depositing a first conductive pattern 250 or a first resist mask 260 on the side surface 110 of the substrate 100 while the substrate 100 is supported in the substantially vertical orientation by the first substrate support 180.

Figure 2A:
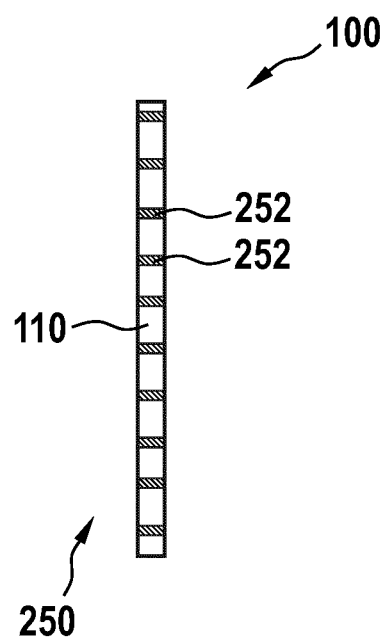
FIG. 2a shows an example of a substrate having a first conductive pattern on the side surface of the substrate.
Figure 2B:
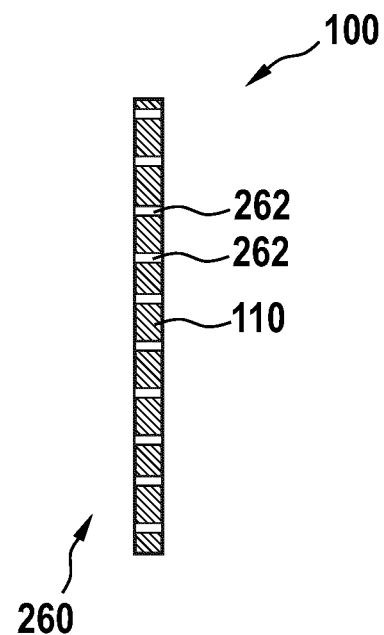
FIG. 2b shows an example of a substrate having a first resist mask on the side surface of the substrate.

FIGS. 2a-b show a top view of the side surface 110 of an exemplary substrate 100 as described herein. A first conductive pattern 250 is deposited on the side surface 110 of the substrate 100 shown in FIG. 2a. As shown, the first conductive pattern 250, indicated by the hashed portions in FIG. 2a, can include a plurality of conductive lines 252. A first resist mask 260 as described herein is deposited on the side surface 110 of the substrate 100 shown in FIG. 2b. As shown, the first resist mask 260, indicated by the hashed portions in FIG. 2b, can include a plurality of line-like openings 262. If the side surface 110 including the first resist mask 260 is coated with a conductive material, e.g. by sputtering or plating, conductive lines similar to the conductive lines 252 are formed in the line-like openings 262 of the first resist mask 260.

A substrate as described herein, such as e.g. the substrate 100, may be provided in a substantially vertical orientation. A substantially vertical orientation of the substrate includes small deviations from an exact vertical orientation, e.g. deviations of 5% or less or 10% or less, possibly even up to 15%.

A substrate as described herein may be a substantially planar or sheet-like substrate. For example, a substrate may be a substrate used in display technology, a semiconductor substrate, a printed circuit board substrate, or any kind of circuit for which it is beneficial to provide an electrical connection between two surfaces of the substrate.

The substrate may, e.g., be an inflexible substrate such as a glass substrate, or a flexible substrate. The substrate may have a variety of possible dimensions, ranging from smartwatch dimension to large area substrates for display manufacturing.

A substrate as described herein may have a first main surface. The substrate may have a second main surface opposite the first main surface. The terms "first main surface" and the "second main surface" can be understood in a manner such that a total area of the substrate is substantially the same as the area of at least one of the first main surface and the second surface.

The substrate may have a side surface between the first main surface and the second main surface. The side surface may connect the first main surface with the second main surface. The area of the side surface is much smaller than the area of the first main surface and the area of the second main surface. The side surface may be a thin strip-like surface between the first major surface and the second major surface.

The substrate may have a thickness, e.g. a thickness of 20 mm or less, particularly 5 mm or less, more particularly 1 mm or less, such as e.g. about 0.5 mm. The thickness may be as small as e.g. 0.1 mm. The distance between the first main surface and the second main surface may correspond to the thickness of the substrate. The side surface may have a length and a width. The length is larger than the width. The width of the side surface may correspond to the thickness of the substrate. For example, the width of the side surface may be 5 mm or less, more particularly 1 mm or less, such as e.g. about 0.5 mm.

The first deposition device 190, or at least a portion thereof, may be arranged above the first substrate support 180. While the substrate 100 is supported by the first substrate support 180, the side surface 110 may be located at a top portion of the substrate 100. The first deposition device 190 may be arranged to deposit the first conductive pattern 250 onto the side surface 110 from above.

A conductive pattern as described herein, such as e.g. the first conductive pattern 250, the second conductive line pattern 450 or the third conductive line pattern 550, may include a plurality of conductive lines. The plurality of conductive lines may include, e.g., 10 or more lines per mm. The plurality of conductive lines may include a first conductive line. The plurality of conductive lines may include a second conductive line.

The first conductive line may be substantially parallel to the second conductive line. The term "substantially parallel" includes conductive lines having an angle from 0 degrees to 15 degrees with respect to each other. The plurality of conductive lines may be a plurality of substantially parallel lines. In other implementations, the conductive lines may not be substantially parallel. A conductive pattern can include conductive lines having an angle relative to each other, e.g., an angle of 20 degrees or more.

According to embodiments described herein, a conductive pattern may be printed on the substrate. Printing results in thicker conductive patterns as compared to other deposition techniques such as e.g. sputtering. Thicker conductive patterns provide the advantage that a more reliable, i.e. electrically and mechanically more stable electrical connection can be formed. In order to further increase thickness, multiple passes can be applied. A conductive pattern as described herein may have a thickness of 20 μm or less and/or 0.5 μm or more. For example, the thickness can be 3 μm or more.

Further, printing provides the advantage that the printed patterns have a good adhesion to the substrate.

The first conductive pattern 250 as described herein may include a conductive line 252. The conductive line 252 may extend from a first edge region of the side surface 110 to a second edge region of the side surface 110. The first edge region may be adjacent to the first main surface 120. The first edge region may be a region where the side surface 110 meets the first main surface 120. The second edge region may be opposite the first edge region. The second edge region may be adjacent to the second main surface 130. The second edge region may be a region where the side surface 110 meets the second main surface 130.

In some implementations, the conductive line 252 may be substantially perpendicular to at least one of the first main surface 120 and the second main surface 130. The term "substantially perpendicular" includes an angle of 90 degrees and small deviations therefrom, e.g. angles from 75 degrees to 105 degrees. In other implementations, the conductive line 252 may be at an angle with respect to at least one of the first main surface and the second main surface, e.g. an angle of 70 degrees or less. The first conductive pattern 250 as described herein may include a plurality of conductive lines. Each conductive line 252 of the plurality of conductive lines may extend from the first edge region of the side surface 110 to the second edge region of the side surface 110. Each conductive line 252 may, for example, be substantially perpendicular to at least one of the first main surface 120 and the second main surface 130.

A conductive line as described herein, e.g. a conductive line of the first conductive pattern 250, the second conductive pattern 450 or the third conductive pattern 550, may have a line width of 200 μm or less and/or 5 μm or more. For example, the lane width may be from 20 to 80 μm. A conductive line may have a line length of 500 μm or less and/or 50 μm or more, such as e.g. a line length of about 100 μm.

A resist mask, such as the first resist mask 260, the second resist mask 460 or the third resist mask 560 as described herein, may cover one or more portion(s) of the substrate. One or more other portions of the substrate may not be covered by the resist mask. The resist mask may be shaped in the form of a pattern. The pattern may be a "negative image" of a target pattern of conductive material that is to be deposited on the substrate. For example, the resist mask may have a plurality of openings shaped in the form of a plurality of lines. The plurality of lines may correspond to a target pattern that is to be deposited on the substrate. After the resist mask is deposited on the substrate, the substrate including the resist mask may be coated, e.g. in a sputtering or plating process, to deposit a conductive material on the substrate. The conductive material is deposited on the resist mask and on the portion(s) of the substrate not covered by the resist mask. No conductive material is deposited on the portion(s) of the substrate covered by the resist mask. In light thereof, the conductive material may be deposited on the substrate in the form of a target pattern determined by the shape of the resist mask. After the deposition process, the resist mask may be removed from the substrate, e.g. in a chemical removal process. A substrate having a target pattern of conductive material formed thereon is provided.

A resist mask as described herein may include a plurality of line-like openings, e.g. openings having the shape of a thin strip or slits, in the resist mask. The plurality of line-like openings of the resist mask may correspond to a plurality of lines of a conductive pattern to be deposited on the substrate using the resist mask. The plurality of line-like openings may include, e.g. 10 or more line-like openings per mm. The plurality of line-like openings may include a first line-like opening or slit. The plurality of line-like openings may include a second line-like opening or slit. The first line-like opening may be substantially parallel to the second line-like opening. The plurality of line-like openings may be a plurality of substantially parallel line-like openings. Alternatively, the line-like openings may be at an angle relative to each other, e.g. an angle of 20 degrees or more.

The first resist mask 260 as described herein may include a line-like opening 262 or slit. The line-like opening 262 may extend from a first edge region, as described herein, of the side surface 110 to a second edge region, as described herein, of the side surface 110. The line-like opening 262 may be substantially perpendicular to at least one of the first main surface 120 and the second main surface 130. Alternatively, the line-like opening 262 may be at an angle with respect to at least one of the first main surface 120 and the second main surface 130, e.g. an angle of 70 degrees or less.

The first resist mask 260 as described herein may include a plurality of line-like openings. Each line-like opening 262 of the plurality of line-like openings may extend from the first edge region of the side surface 110 to the second edge region of the side surface 110. Each line-like opening 262 may be substantially perpendicular to at least one of the first main surface and the second main surface.

The first deposition device 190 may include or be a printing device. The first deposition device 190 may be configured to print the first conductive pattern 250 and/or the first resist mask 260 on the side surface 110 of the substrate. The first deposition device may be a screen printing device. The first deposition device may include a screen for screen printing. The screen may be arranged above the first substrate support 180. The first deposition device 190 may be configured to print the first conductive pattern 250 and/or the first resist mask 260 on the side surface 110 of the substrate 100 by urging a printing material through the screen. For printing the first conductive pattern 250 (or the second conductive pattern 450 or the third conductive pattern 550, or any other conductive pattern described herein), the printing material urged through the screen may be a conductive material, e.g. a conductive ink or paste, such as a silver or copper ink, or any other kind of conductive screen printing material. For printing the first resist mask 260 (or the second resist mask 460 or the third resist mask 560 as described herein), the printing material urged through the screen may be an insulating material, e.g. a polymer.

A deposition apparatus 10 according to embodiments described herein may include a layer deposition device for depositing a conductive material on the substrate. The layer deposition device may be configured to deposit the conductive material on at least the side surface 110 of the substrate 100 including the first resist mask 260. The layer deposition device may be, e.g., a sputtering device or a plating device.

Figure 3A:
FIGS. 3a-c show a deposition apparatus according to embodiments described herein, the deposition apparatus including a first deposition device, a second deposition device and a third deposition device.
Figure 3B:
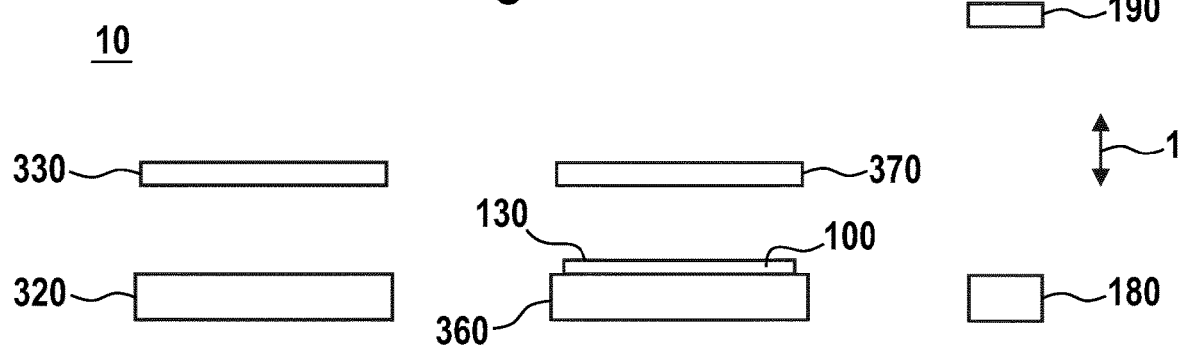
Figure 3C:
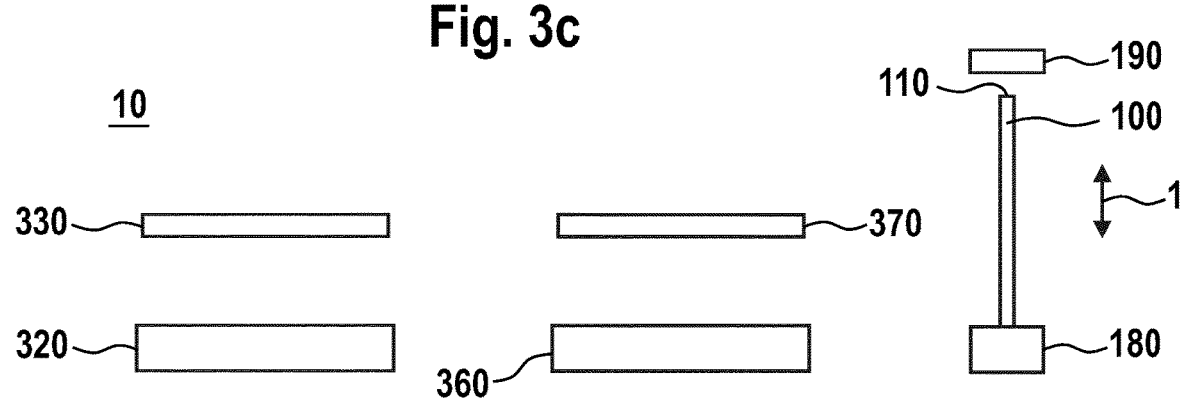

FIGS. 3*a-c* show a deposition apparatus 10 according to embodiments described herein. The deposition apparatus 10 includes a first deposition device 190, a second deposition device 330 and a third deposition device 370. The deposition apparatus 10 includes a first substrate support 180, a second substrate support 320 and a third substrate support 360. As shown in FIG. 3*a*, the substrate 100 can be supported by the second substrate support 320 in a substantially horizontal orientation. The first main surface 120 of the substrate 100 can face upward. The second deposition device 330 can deposit a second conductive pattern or a second resist mask on the first main surface 120 of the substrate 100. The substrate 100 can be moved from the second substrate support 320 to the third substrate support 360. As shown in FIG. 3*b*, the substrate 100 can be supported by the third substrate support 360 in a substantially horizontal orientation. The second main surface 130 of the substrate 100 can face upward. The third deposition device 370 can deposit a third conductive pattern or a third resist mask on the second main surface 130 of the substrate 100. The substrate 100 can be moved from the third substrate support 360 to the first substrate support 180. The first deposition device 190 can deposit the first conductive pattern 250 on the side surface 110 of the substrate 100.

Figure 4A:
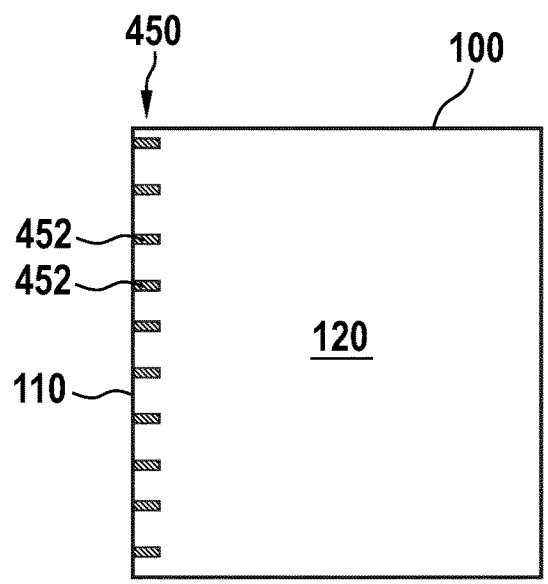
FIG. 4a shows an example of a substrate having a second conductive pattern on the first main surface of the substrate.
Figure 4B:
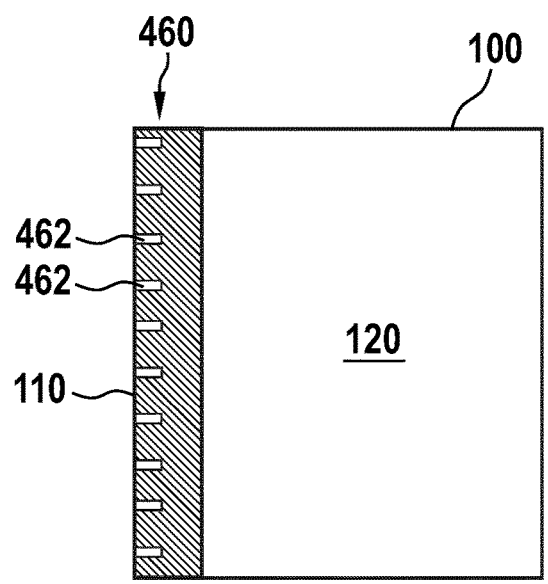
FIG. 4b shows an example of a substrate having a second resist mask on the first main surface of the substrate.

FIGS. 4*a-b* show a top view of the first main surface 120 of an exemplary substrate 100. A second conductive pattern 450 as described herein is deposited on the first main surface 120 shown in FIG. 4*a*. As shown, the second conductive pattern 450, indicated by the hashed portions in FIG. 4*a*, can include a plurality of conductive lines 452. A second resist mask 460 as described herein is deposited on the first main surface 120 shown in FIG. 4*b*. As shown, the second resist mask 460, indicated by the hashed portions in FIG. 4*b*, can include a plurality of line-like openings 462.

Figure 5A:
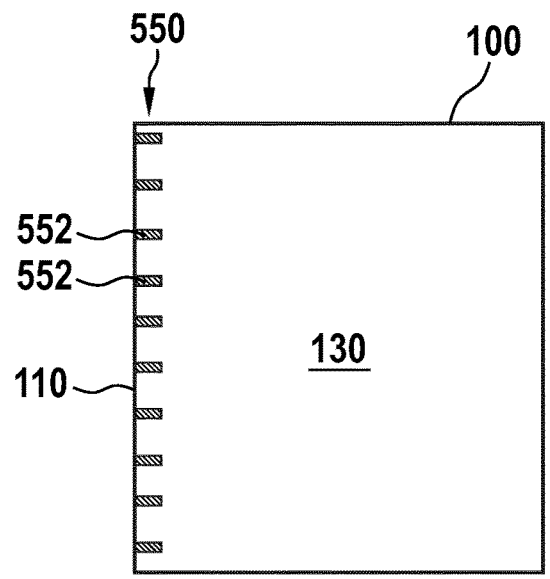
FIG. 5a shows an example of a substrate having a third conductive pattern on the second main surface of the substrate.
Figure 5B:
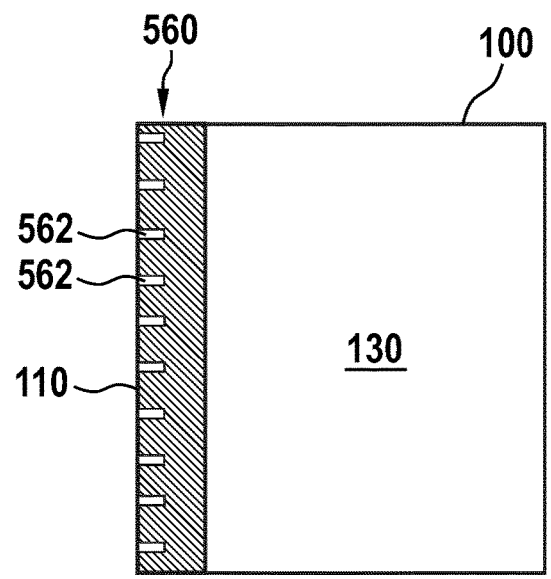
FIG. 5b shows an example of a substrate having a third resist mask on the second main surface of the substrate.

FIGS. 5*a-b* show a top view of the second main surface 130 of an exemplary substrate 100. A third conductive pattern 550 including a plurality of conductive lines 552 is deposited on the second main surface 130 shown in FIG. 5*a*. A third resist mask 560 including a plurality of line-like openings 562 is deposited on the second main surface 130 shown in FIG. 5*b*.

A deposition apparatus 10 according to embodiments described herein may include a second deposition device 330 for depositing a second conductive pattern 450 or a second resist mask 460 on the first main surface 120 of the substrate 100. A portion of the second conductive pattern 450 may contact a portion of the first conductive pattern 250. A portion of the second resist mask 460 may contact a portion of the first resist mask 260.

The second deposition device 330 may include or be a printing device, particularly a screen printing device. The second deposition device 330 may be configured to print the second conductive pattern 450 and/or the second resist mask 460 on the first main surface 120 of the substrate 100.

A deposition apparatus 10 according to embodiments described herein may include a second substrate support 320. The second substrate support 320 may be configured for supporting the substrate 100 in a substantially horizontal orientation. The second deposition device 330 may be arranged for depositing the second conductive pattern 450 or the second resist mask 460 on the first main surface 120 of the substrate 100 while the substrate 100 is supported by the second substrate support 320.

The second conductive pattern 450 as described herein may include a conductive line 452. The conductive line 452 may extend from a first end of the conductive line 452 to a second end of the conductive line 452. The first end of the conductive line 452 may be located at, or adjacent to, a region where the first main surface 120 meets the side surface 110. The conductive line 452 of the second conductive pattern 450 may contact a conductive line 252 of the first conductive pattern 250. An electric current can flow from the conductive line 452 to the conductive line 252 or vice versa. The conductive line 452 together with the conductive line 252 may form an electrical connection from the first main surface 120 to the side surface 110. The second conductive pattern 450 may include a plurality of conductive lines. The plurality of conductive lines may be substantially parallel conductive lines or conductive lines at an angle relative to each other. Each conductive line 452 of the plurality of conductive lines may extend from a first end of the conductive line 452 to a second end of the conductive line 452. The first end of each conductive line 452 may be located at, or adjacent to, a region where the first main surface 120 meets the side surface 110. Each conductive line 452 of the plurality of conductive lines may contact a corresponding conductive line 252 of the first conductive pattern 250. A plurality of electrical connections between the side surface 110 and the first main surface 120 may be formed.

The second resist mask 460 as described herein may include a line-like opening 462 or slit. The line-like opening 462 may extend from a first end of the line-like opening 462 to a second end of the line-like opening 462. The first end of the line-like opening 462 may be located at, or adjacent to, a region where the first main surface 120 meets the side surface 110. The first end of the line-like opening 462 of the second resist mask 460 may be adjacent to an end of a line-like opening 262 of the first resist mask 260. After the side surface 110 including the first resist mask 260 and the first main surface 120 including the second resist mask 460 are coated with a conductive material, a conductive line is formed in the line-like opening 262 of the first resist mask 260 and a conductive line is formed in the line-like opening 462 of the second resist mask 460, wherein the two conductive lines contact each other so that a current can flow between the two conductive lines. The second resist mask 460 may include a plurality of line-like openings. The plurality of line-like openings may be substantially parallel to each other or may be at an angle relative to each other. Each line-like opening 462 of the plurality of line-like openings may extend from a first end of the line-like opening 462 to a second end of the line-like opening 462. The first end of each line-like opening 462 may be located at, or adjacent to, a region where the first main surface 120 meets the side surface 110. The first end of each line-like opening 462 of the second resist mask 460 may be adjacent to, or in communication with, an end of a corresponding line-like opening 262 of the first resist mask 260.

A deposition apparatus 10 according to embodiments described herein may include a third deposition device 370 for depositing a third conductive pattern 550 or a third resist mask 560 on the second main surface 130 of the substrate 100. A portion of the third conductive pattern 550 may contact a portion of the first conductive pattern 250. A portion of the third resist mask 560 may contact a portion of the first resist mask 260.

The third deposition device 370 may include or be a printing device, particularly a screen printing device. The third deposition device 370 may be configured to print the third conductive pattern 550 and/or the third resist mask 560 on the second main surface 130 of the substrate 100.

A deposition apparatus 10 according to embodiments described herein may include a third substrate support 360. The third substrate support 360 may be configured for supporting the substrate 100 in a substantially horizontal orientation. The third deposition device 370 may be arranged for depositing the third conductive pattern 550 or the third resist mask 560 on the second main surface 130 of the substrate 100 while the substrate 100 is supported by the third substrate support 360.

The third conductive pattern 550 as described herein may include a conductive line 552. The conductive line 552 may extend from a first end of the conductive line 552 to a second end of the conductive line 552. The first end of the conductive line 552 may be located at, or adjacent to, a region where the second main surface 130 meets the side surface 110.

The conductive line 552 of the third conductive pattern 550 may contact a conductive line 252 of the first conductive pattern 250. The conductive line 252 of the first conductive pattern 250 may contact a conductive line 452 of the second conductive pattern 450, as described herein. The conductive line 452 together with the conductive line 252 and the conductive line 552 may form an electrical connection from the first main surface 120 to the second main surface 130 via the side surface 110. In light thereof, embodiments described herein provide the advantage that an electrical connection can be formed between the first main surface 120 and the second main surface 130 without the need for a through-hole or via in the substrate 100 to establish the electrical connection.

The first conductive pattern 250 as described herein may include a first plurality of conductive lines. The second conductive pattern 450 may include a second plurality of conductive lines. The third conductive pattern 550 may include a third plurality of conductive lines. Each conductive line 252 of the first plurality of conductive lines may contact a conductive line 452 of the second plurality of conductive lines and a conductive line 552 of the third plurality of conductive lines to form an electrical connection from the first main surface 120 to the second main surface 130. In light thereof, embodiments described herein provide the advantage that a plurality of electrical connections can be formed between the first main surface 120 and the second main surface 130 without the need for through-holes or via in the substrate 100 to establish the electrical connections.

The third resist mask 560 as described herein may include a line-like opening 562 or slit. The line-like opening 562 may extend from a first end of the line-like opening 562 to a second end of the line-like opening 562. The first end of the line-like opening 562 may be located at, or adjacent to, a region where the second main surface 130 meets the side surface 110. The first end of the line-like opening 562 of the third resist mask 560 may be adjacent to an end of a line-like opening 262 of the first resist mask 260. The line-like opening 262 of the first resist mask 260 may be adjacent to a line-like opening 462 of the second resist mask 460, as described herein. After the side surface 110 including the first resist mask 260, the first main surface 120 including the second resist mask 460 and the second main surface 130 including the third resist mask 560 are coated with a conductive material, a conductive line is formed in the line-like opening 262 of the first resist mask 260, a conductive line is formed in the line-like opening 462 of the second resist mask 460 and a conductive line is formed in the line-like opening 562 of the third resist mask 560. The three conductive lines form an electrical connection from the first main surface 120 to the second main surface 130 via the side surface 110.

The first resist mask 260 as described herein may include a first plurality of line-like openings. The second resist mask 460 may include a second plurality of line-like openings. The third resist mask 560 may include a third plurality of line-like openings. Each line-like opening 262 of the first plurality of line-like openings may be adjacent to, or in communication with, a line-like opening 462 of the second plurality of line-like openings and a line-like opening 562 of the third plurality of line-like openings. When a conductive material is deposited in the line-like opening 262 and in the adjacent line-like openings 462 and 562, an electrical connection from the first main surface 120 to the second main surface 130 via the side surface 110 is formed. In light thereof, by coating the side surface 110 including the first resist mask 260, the first main surface 120 including the second resist mask 460 and the second main surface 130 including the third resist mask 560 with a conductive material, a plurality of electrical connections from the first main surface 120 to the second main surface 130 are formed.

Figure 6:
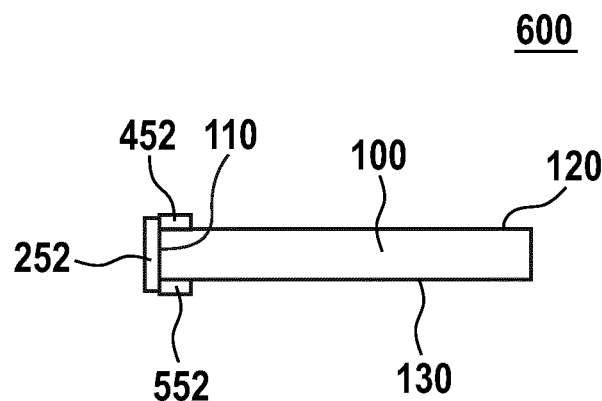
FIGS. 6-7 show examples of a substrate having a first, second and third conductive pattern.
Figure 7:
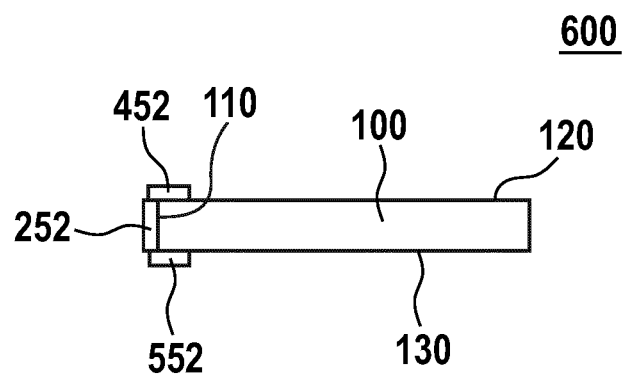

FIGS. 6-7 show a substrate structure 600 according to embodiments described herein. FIG. 6 shows an example of a substrate structure 600 resulting from depositing the first conductive pattern 250 on the side surface 110 after depositing the second conductive pattern 450 on the first main surface 120 and the third conductive pattern 550 on the second main surface 130. FIG. 7 shows an example of a substrate structure 600 resulting from depositing the first conductive pattern 250 before depositing the second conductive pattern 450 and the third conductive pattern 550. As shown in FIGS. 6-7, a conductive line 252 of the first conductive pattern 250 is deposited on the side surface 110. A conductive line 452 of the second conductive pattern 450 is deposited on the first main surface 120. A conductive line 552 of the third conductive pattern 550 is deposited on the second main surface 130. The conductive line 252 contacts the conductive line 452 and the conductive line 552. The conductive line 252 together with the conductive line 452 and the conductive line 552 provide an electrical connection from the first main surface 120 to the second main surface 130 via the side surface 110. In light thereof, embodiments described herein provide the advantage that an electrical connection from the first main surface 120 to the second main surface 130 can be provided while avoiding the formation of a through-hole through the substrate 100.

Figure 8:
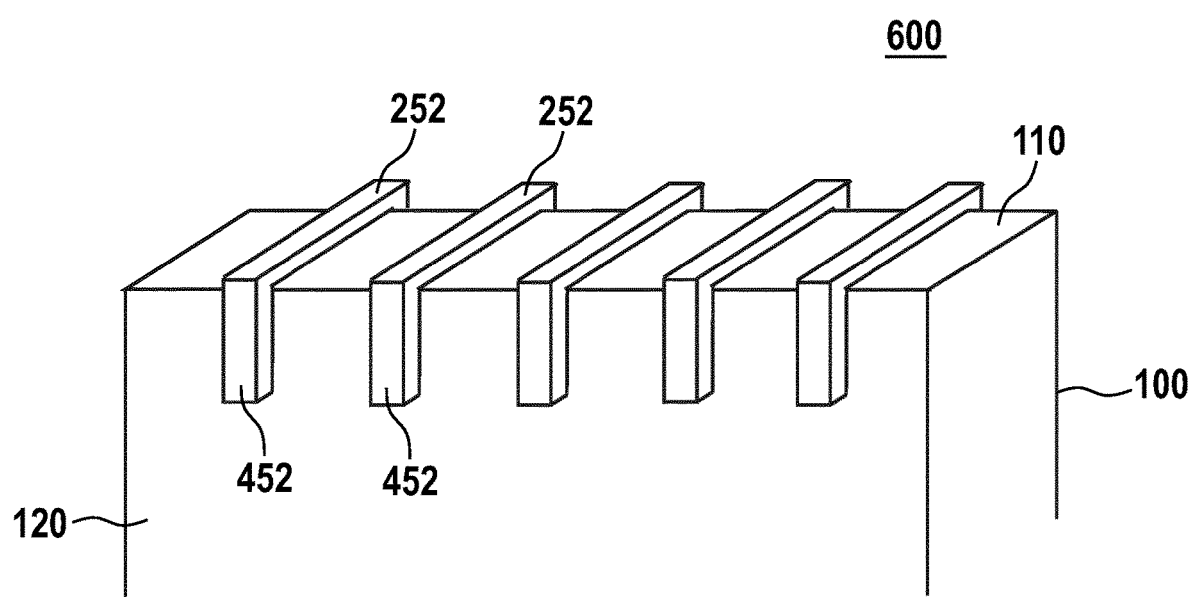
FIG. 8 shows a substrate structure according to embodiments described herein.

FIG. 8 shows a substrate structure 600 according to embodiments described herein. The substrate structure 600 includes a plurality of electrical connections between the first main surface 120 and the second main surface 130. Each electrical connection includes a conductive line 452 on the first main surface 120, a conductive line 252 on the side surface 110, and a conductive line 552 on the second main surface 130. The conductive line 252 on the side surface 110 contacts the conductive line 452 on the first main surface 120 and the conductive line 552 on the second main surface 130.

Figure 9:
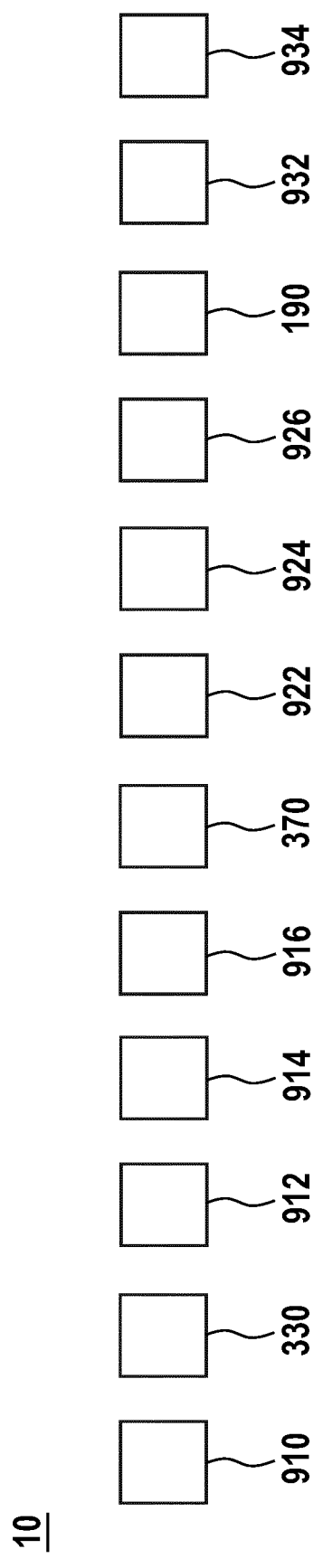
FIG. 9 shows a deposition apparatus according to embodiments described herein.

FIG. 9 shows a deposition apparatus 10 according to embodiments described herein. In FIG. 9, substrates are processed from left to right. The deposition apparatus 10 includes a storing unit 910, e.g. a cassette, for storing a plurality of substrates. The deposition apparatus 10 includes the second deposition device 330 as described herein, e.g. for depositing the second conductive pattern 450 or the second resist mask 460 on the first main surface 120 of the substrate 100. The deposition apparatus 10 includes an inspection device 912, e.g. an optical inspection device, for inspecting the second conductive pattern 450 or the second resist mask 460. The deposition apparatus 10 includes a drying device 914 for drying the second conductive pattern 450 or the second resist mask 460. The deposition apparatus 10 includes an orientation-changing device 916, e.g. for flipping the substrate 100 by about 180 degrees from a first horizontal orientation to a second horizontal orientation.

The deposition apparatus 10 shown in FIG. 9 includes the third deposition device 370 as described herein, e.g. for depositing the third conductive pattern 550 or the third resist mask 560 on the second main surface 130 of the substrate 100. The deposition apparatus 10 includes an inspection device 922, e.g. an optical inspection device, for inspecting the third conductive pattern 550 or the third resist mask 560. The deposition apparatus 10 includes a drying device 924 for drying the third conductive pattern 550 or the third resist mask 560. The deposition apparatus 10 includes an orientation-changing device 926, e.g. for flipping the substrate 100 by about 90 degrees from a horizontal orientation to a vertical orientation.

The deposition apparatus 10 shown in FIG. 9 includes the first deposition device 190 as described herein, e.g. for depositing the first conductive pattern 250 or the first resist mask 260 on the side surface 110 of the substrate 100. The deposition apparatus 10 includes an inspection device 932, e.g. an optical inspection device, for inspecting the first conductive pattern 250 or the first resist mask 260. The deposition apparatus 10 includes a drying device 934 for drying the first conductive pattern 250 or the first resist mask 260.

The deposition apparatus 10 shown in FIG. 9 is an exemplary embodiment shown for the purpose of illustration. Several of the components shown in FIG. 9 can be omitted. For example, the storing unit 910, the inspection devices 912, 922 and 932, and the drying devices 914, 924 and 934 are optional components and can be omitted. Further, the deposition apparatus 10 can include additional components not shown in FIG. 9, such as an unloading unit for unloading the substrates. Further, the order of processing the surfaces of the substrates is also exemplary and can be changed, e.g. by performing printing on the side surface first and then on the two main surfaces, or any other order depending on the application.

A deposition apparatus 10 as described herein may include a first orientation-changing device, e.g. the orientation-changing device 926 shown in FIG. 9, for changing the orientation of the substrate 100 from a first orientation of the substrate to a second orientation of the substrate. The first orientation-changing device may be configured for changing the orientation of the substrate 100 by an angle of about 90 degrees. The first orientation-changing device may be configured for changing the orientation of the substrate 100 from a substantially vertical orientation to a substantially horizontal orientation and/or from a substantially horizontal orientation to a substantially vertical orientation. The term "substantially horizontal" includes a substrate orientation which can deviate from exact horizontality by an angle of 5 degrees or less, 10 degrees or less, or in some cases even up to 15 degrees.

A deposition apparatus 10 as described herein may include a second orientation-changing device, e.g. orientation-changing device 916 shown in FIG. 9, for changing the orientation of the substrate 100. The second orientation-changing device may be configured for changing the orientation of the substrate 100 by an angle of about 180 degrees. The second orientation-changing device may be configured for changing the orientation of the substrate 100 from a first substantially horizontal orientation to a second substantially horizontal orientation. In the first substantially horizontal orientation, the first main surface 120 of the substrate 100 may face upward. In the second substantially horizontal orientation, the second main surface 130 of the substrate 100 may face upward.

The first orientation-changing device may be arranged upstream of the first deposition device 190. The second orientation-changing device may be arranged upstream of the first orientation-changing device.

The terms "upstream" and "downstream" are defined relative to a processing direction, or processing flow, of the deposition apparatus 10.

In some implementations, the two main surfaces of the substrate are provided with a conductive pattern first, followed by patterning the side surface of the substrate. The substrate 100 may be processed by depositing a conductive pattern on the first main surface 120 in a first substantially horizontal orientation of the substrate 100, followed by flipping the substrate 100, followed by depositing a conductive pattern on the second main surface 130 in a second substantially horizontal orientation of the substrate 100, followed by changing the orientation of the substrate 100 by about 90 degrees, followed by depositing a conductive pattern on the side surface 110 in a substantially vertical orientation of the substrate 100.

In other implementations, the surfaces of the substrate may be processed in a different order. For example, the substrate 100 may be processed by depositing a conductive pattern on the first main surface 120 in a first substantially horizontal orientation of the substrate 100, followed by changing the orientation of the substrate 100 by about 90 degrees, followed by depositing a conductive pattern on the side surface 110 in a substantially vertical orientation of the substrate 100, followed by changing the orientation of the substrate 100 by another 90 degrees, followed by depositing a conductive pattern on the second main surface 130 in a second substantially horizontal orientation of the substrate 100. Any other order of processing the surfaces of the substrate is also possible. The same applies to the order for depositing the resist masks on the surfaces of the substrate.

Figure 10:
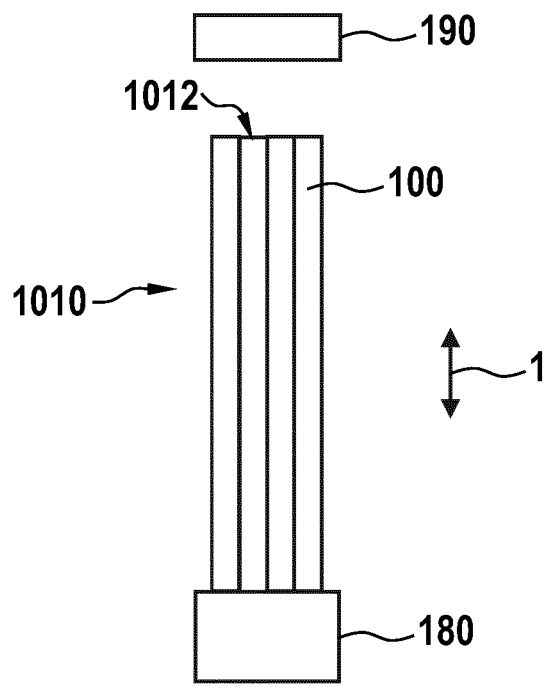
FIG. 10 shows a deposition apparatus according to embodiments described herein.

FIG. 10 shows a deposition apparatus 10 according to embodiments described herein.

The first substrate support 180 as described herein may be configured for supporting a stack of substrates 1010 in a substantially vertical orientation. The stack of substrates 1010 in the substantially vertical orientation may have a top portion 1012. The first deposition device 190 may be configured for depositing, particularly printing, a conductive pattern 1150 or a resist mask 1160 on the top portion 1012 of the stack of substrates 1010 while the stack of substrates 1010 is supported in the substantially vertical orientation by the first substrate support 180.

Figure 11A:
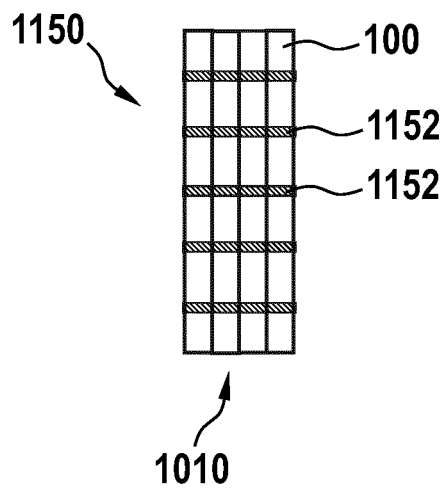
FIGS. 11a-b show a top view of a stack of substrates.
Figure 11B:
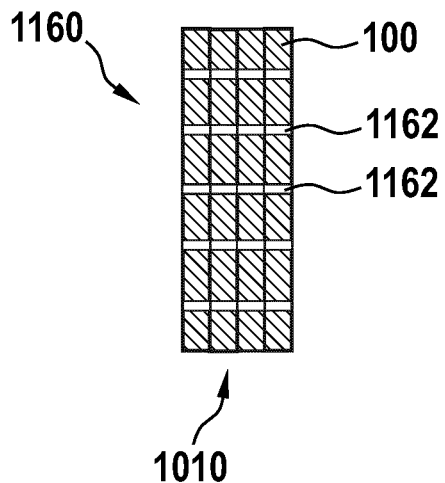

FIG. 11a, showing a top view of a stack of substrates 1010, shows an example of a conductive pattern 1150 (hashed) on the top portion 1012 of the stack of substrates 1010. FIG. 11b shows an example of a resist mask 1160 (hashed) on the top portion 1012 of the stack of substrates 1010.

The stack of substrates 1010 as described herein may include two, three, four, five or more substrates. The stack of substrates 1010 may include the substrate 100 as described herein. The stack of substrates can be held together, e.g., by a clamping device.

The stack of substrates 1010 can include a plurality of separators. Each separator can be arranged between two adjacent substrates of the stack of substrates 1010. Each separator can be a sheet-like separator. For example, each separator can be a sheet of paper. Providing the separators between the substrates in the stack has several advantages. For example, the number of fully printed lines can be increased, a sliding of the substrates can be facilitated so that alignment of the substrates is easier, the separators can act as soft layers between the substrates so that particle generation is reduced, and the separators facilitate substrate detachment after drying or curing of the printed material.

Each substrate of the stack of substrates 1010 may have a first main surface, a second main surface and a side surface between the first main surface and the second main surface. While the stack of substrates 1010 is supported in the substantially vertical orientation by the first substrate support, the side surface of each substrate in the stack of substrates 1010 may be at the top portion of the stack of substrates 1010. The top portion 1012 of the stack of substrates 1010 may include, or be formed by, the side surfaces of the substrates in the stack of substrates 1010.

The conductive pattern 1150 or resist mask 1160 may be deposited on the side surfaces of a plurality of substrates, or even all substrates, of the stack of substrates 1010. The stack of substrates 1010 may include the substrate 100 as described herein. The stack of substrates 1010 may include a second substrate. A first portion of the conductive pattern 1150 or of the resist mask 1160 may be deposited on the side surface 110 of the substrate 100. For example, the first portion of the conductive pattern 1150 may be the first conductive pattern 250 as described herein, or the first portion of the resist mask 1160 may be the first resist mask 260 as described herein. A second portion of the conductive pattern 1150 or of the resist mask 1160 may be deposited on a side surface of the second substrate. In light thereof, embodiments described herein provide the advantage that the side surfaces of multiple substrates can be provided with a conductive pattern or resist mask in a single processing cycle. The throughput of the deposition apparatus can be increased.

The conductive pattern 1150 may include a plurality of conductive lines 1152. Each conductive line 1152 of the plurality of conductive lines may extend across multiple side surfaces of substrates of the stack of substrates 1010. The resist mask 1160 may include a plurality of line-like openings 1162. Each line-like opening 1162 of the plurality of line-like openings may extend across multiple side surfaces of substrates of the stack of substrates 1010.

After depositing the conductive pattern 1150 or the resist mask 1160 on the stack of substrates 1010, the substrates of the stack of substrates 1010 can be further processed one by one. For example, the substrate 100 can be taken as a single substrate from the stack of substrates 1010. Therein, the substrate 100 includes the first conductive pattern 250 or the first resist mask 260 resulting from the deposition of the conductive pattern 1150 or the resist mask 1160 on the stack of substrates 1010. After the substrate 100 is taken from the stack of substrates 1010, the first main surface 120 of the substrate 100 can be provided with the second conductive pattern 450 or the second resist mask 460 as described herein. The second main surface 130 of the substrate 100 can be provided with the third conductive pattern 550 or the third resist mask 560 as described herein.

Figure 12:
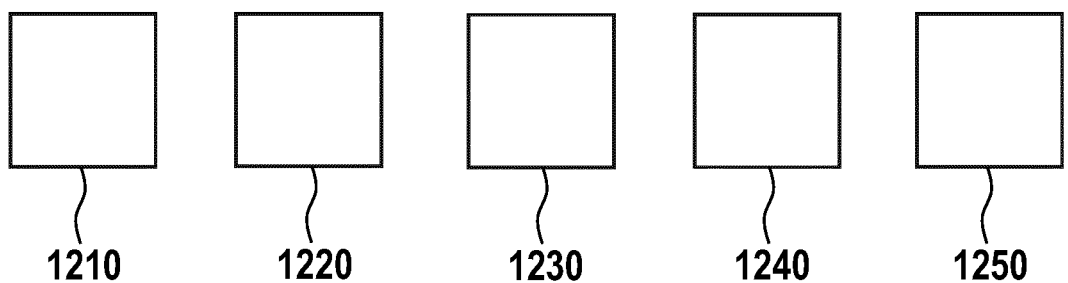
FIG. 12 shows a deposition apparatus according to embodiments described herein.

FIG. 12 shows a deposition apparatus 10 according to embodiments described herein.

According to a further embodiment, a deposition apparatus 10 is provided. The deposition apparatus includes a first printing device 1210. The deposition apparatus 10 includes a first orientation-changing device 1220 downstream of the first printing device. The deposition apparatus 10 includes a second printing device 1230 downstream of the first orientation-changing device. The deposition apparatus 10 includes a second orientation-changing device 1240 downstream of the second printing device. The deposition apparatus 10 includes a third printing device 1250 downstream of the second orientation-changing device.

The terms "upstream" and "downstream" are defined relative to a processing direction, or processing flow, of the deposition apparatus 10. For example, that the first orientation-changing device 1220 is downstream of the first printing device 1210 can be understood in the sense that the first orientation-changing device 1220 is arranged relative to the first printing device 1210 in a manner such that substrates are processed by the first printing device 1210 and thereafter transferred to the first orientation-changing device 1220 and processed by the first orientation-changing device 1220.

As described herein, the first main surface 120, the second main surface 130 and the side surface 110 of a substrate 100 may be processed in different orders. For example, in an implementation where the two main surfaces of the substrate are provided with a conductive pattern before the side surface is provided with a conductive pattern, the first printing device 1210 may be the second deposition device 330 as described herein, the second printing device 1230 may be the third deposition device 370 as described herein, and the third printing device 1250 may be the first deposition device 190 as described herein. In another implementation, the side surface 110 may be processed in between processing of the first main surface 120 and the second main surface 130. In such an implementation, the first printing device 1210 may be the second deposition device 330 as described herein, the second printing device 1230 may be the first deposition device 190 as described herein, and the third printing device 1250 may be the third deposition device 370 as described herein.

Depending on the order in which the surfaces of the substrate are processed, the first orientation-changing device may be configured to change the orientation of the substrate by about 90 degrees or by about 180 degrees. The first orientation-changing device may be configured for changing the orientation of the substrate 100 from a substantially vertical orientation to a substantially horizontal orientation or from a substantially horizontal orientation to a substantially vertical orientation, as described herein. The first orientation-changing device may be configured for changing the orientation of the substrate 100 from a first substantially horizontal orientation to a second substantially horizontal orientation, as described herein.

Likewise, depending on the order in which the surfaces of the substrate are processed, the second orientation-changing device may be configured to change the orientation of the substrate by about 90 degrees or by about 180 degrees. The second orientation-changing device may be configured for changing the orientation of the substrate 100 from a substantially vertical orientation to a substantially horizontal orientation or from a substantially horizontal orientation to a substantially vertical orientation, as described herein. The second orientation-changing device may be configured for changing the orientation of the substrate 100 from a first substantially horizontal orientation to a second substantially horizontal orientation, as described herein.

At least one of the first orientation-changing device and the second orientation-changing device may be configured for changing the orientation of the substrate 100 from a substantially vertical orientation to a substantially horizontal orientation or from a substantially horizontal orientation to a substantially vertical orientation.

The first printing device, the second printing device and/or the third pattern deposition device may be a screen printing device.

A deposition apparatus 10 according to embodiments described herein may include a substrate support associated with the first printing device 1210. The deposition apparatus 10 may include a substrate support associated with the second printing device 1230. The deposition apparatus 10 may include a substrate support associated with the third printing device 1250.

A deposition apparatus 10 according to embodiments described herein may include a vertically oriented substrate support. The term "vertically oriented substrate support" refers to a substrate support configured for supporting a substrate in a substantially vertical orientation, as described herein. At least one of the substrate support associated with the first printing device 1210, the substrate support associated with the second printing device 1230 and the substrate support associated with the third printing device 1250 may be a vertically oriented substrate support.

The deposition apparatus 10 may include at least one horizontally oriented substrate support, e.g. one horizontally oriented substrate support or two horizontally oriented substrate supports. The term "horizontally oriented substrate support" refers to a substrate support configured for supporting a substrate in a substantially horizontal orientation, as described herein. At least one of the substrate support associated with the first printing device 1210, the substrate support associated with the second printing device 1230 and the substrate support associated with the third printing device 1250 may be a horizontally oriented substrate support.

According to a further embodiment, a method of deposition on a substrate is provided. The method includes providing a substrate 100 in a substantially vertical orientation. The first substrate has a first main surface 120, a second main surface 130 opposite the first main surface 120 and a side surface 110 between the first main surface 120 and the second main surface 130. The method includes depositing a first conductive pattern 250 or a first resist mask 260 on the side surface 110 of the substrate 100 while the first substrate is in the substantially vertical orientation.

The first conductive pattern 250 and/or the first resist mask 260 may be deposited on the side surface 110 by a first deposition device 190 as described herein.

The substrate 100 may be provided, or supported, in the substantially vertical orientation by the first substrate support 180 as described herein.

Depositing the first conductive pattern 250 or the first resist mask 260 on the side surface 110 of the substrate 100 may include printing the first conductive pattern 250 or the first resist mask 260 on the side surface 110 of the substrate 100.

A method according to embodiments described herein may include depositing, e.g. printing, a second conductive pattern 450 or a second resist mask 460 on the first main surface 120, wherein a portion of the second conductive pattern 450 contacts a portion of the first conductive pattern 250 or a portion of the second resist mask 460 contacts a portion of the first resist mask 260. The second conductive pattern 450 may be deposited by a second deposition device 330 as described herein. The second conductive pattern 450 may be deposited while the substrate 100 is held in a substantially horizontal orientation, e.g. by the second substrate support 320 as described herein.

A method according to embodiments described herein may include depositing, e.g. printing, a third conductive pattern 550 or a third resist mask 560 on the second main surface 130, wherein a portion of the third conductive pattern 550 contacts a portion of the first conductive pattern 250 or a portion of the third resist mask 560 contacts a portion of the first resist mask 260. The third conductive pattern 550 may be deposited on the second main surface 130 by a third deposition device 370 as described herein. The third conductive pattern 550 may be deposited while the substrate 100 is held in a substantially horizontal orientation, e.g. by the third substrate support 360 as described herein.

The method according to embodiments described herein may include changing the orientation of the substrate 100 from the substantially vertical orientation to a substantially horizontal orientation or from a substantially horizontal orientation to the substantially vertical orientation.

The method according to embodiments described herein may include changing the orientation of the substrate 100 from a first orientation to a second orientation. The method may include changing the orientation of the substrate 100 from the second orientation to a third orientation. At least one of the first orientation, the second orientation and the third orientation may be a substantially vertical orientation. At least one of the first orientation, the second orientation and the third orientation may be a substantially horizontal orientation.

The method according to embodiments described herein may include providing a stack of substrates 1010 in a substantially vertical orientation. The stack of substrates 1010 may include the substrate 100. The stack of substrates 1010 in the substantially vertical orientation may have a top portion 1012. The method may include depositing a conductive pattern 1150 or a resist mask 1160 on the top portion 1012 of the stack while the stack of substrates 1010 is supported in the substantially vertical orientation.

According to a further embodiment, a substrate structure 600 is provided. The substrate structure 600 includes a substrate 100 having a first surface and a second surface opposite the first surface. The first surface of the substrate 100 may be the first main surface 120 as described herein. The second surface may be the second main surface 130 as described herein. The substrate has a side surface 110 between the first surface and the second surface. The substrate structure 600 further includes a plurality of electrical connections between the first surface and the second surface. Each electrical connection includes a conductive line 452 on the first surface, a conductive line 252 on the side surface, and a conductive line 552 on the second surface. The conductive line 252 on the side surface contacts the conductive line 452 on the first surface and the conductive line 552 on the second surface.

According to a further embodiment, a substrate structure is provided. The substrate structure includes a substrate 100 having a first surface, a second surface opposite the first surface and a side surface 110 between the first surface and the second surface. The substrate structure includes a resist mask. The resist mask includes a first resist mask portion covering a portion of the side surface, the first resist mask portion having a first plurality of line-like openings. The first resist mask portion may be the first resist mask 260 as described herein. The resist mask includes a second resist mask portion covering a portion of the first surface, the second resist mask portion having a second plurality of line-like openings. The second resist mask portion may be the second resist mask 460 as described herein. The resist mask includes a third resist mask portion covering a portion of the second surface, the third resist mask portion having a third plurality of line-like openings. The third resist mask portion may be the third resist mask 560 as described herein. Each line-like opening 262 of the first plurality of line-like openings is adjacent to a line-like opening 462 of the second plurality of line-like openings and to a line-like opening 562 of the third plurality of line-like openings.

Figure 13:
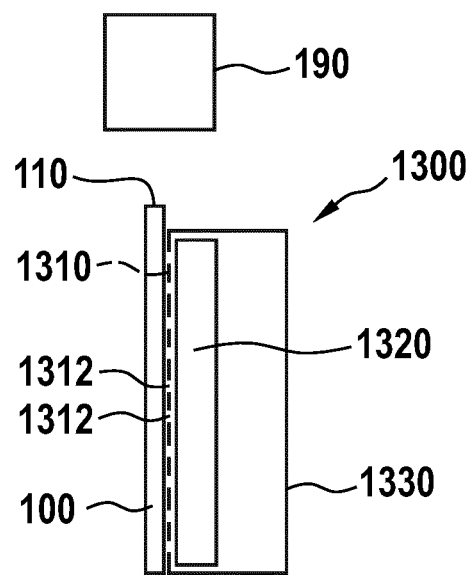
FIG. 13 shows a substrate support according to embodiments described herein.

FIG. 13 shows a substrate support 1300 according to embodiments described herein.

According to a further embodiment, a substrate support 1300 is provided. The substrate support 1300 may be for supporting a substrate 100 in a substantially vertical orientation. The substrate support 1300 includes a first surface 1310, the first surface 1310 being a stationary surface which is substantially vertical or a movable surface which is movable between a first position and a second position, wherein in the second position the first surface 1310 is substantially vertical. The substrate support 1300 includes a substrate attraction device 1320 adjacent to the first surface 1310.

The substrate 100 may have a first main surface 120, a second main surface 130 and a side surface 110 as described herein. A substrate support 1300 according to embodiments described herein may be configured for holding the substrate 100 in a substantially vertical orientation in a manner such that the side surface 110 of the substrate 100 is exposed for deposition of a material on the side surface 110, e.g. by the first deposition device 190 as described herein. In particular, no holding elements (such as clamps or the like) for holding the substrate 100 may be provided at or on the side surface 110. In light thereof, the side surface 110 may be free for deposition of, e.g., a first conductive pattern 250 or a first resist mask 260 on the side surface 110.

A substrate support 1300 according to embodiments described herein may include a support member 1330. The first surface 1310 may be a surface, particularly a side surface, of the support member 1330.

The substrate attraction device 1320 is configured to attract the substrate 100. The substrate attraction device 1320 may be a substrate suctioning device. The substrate attraction device 1320 may be for suctioning the substrate 100 against the first surface 1310. The substrate attraction device may be, for example, a vacuum chuck, an electronic chuck, or the like. The substrate attraction device 1320 and the substrate 100 may be arranged at opposite sides of the first surface 1310.

The first surface 1310 may include a plurality of openings 1312. The plurality of openings 1312 may allow air to pass through the first surface 1310. The plurality of openings 1312 may allow the substrate attraction device 1320, e.g. a substrate suctioning device, to suction the substrate 100 against the first surface 1310. The substrate attraction device 1320 may be a vacuum suctioning device.

The substrate attraction device 1320 may be arranged in or at the support member 1330 of the substrate support 1300.

The first surface 1310 may be a stationary surface, the stationary surface being a substantially vertical surface. The first surface 1310 may be fixed in a vertical orientation.

Alternatively, the first surface 1310 may be movable from a first position to a second position. In the first position, the first surface 1310 may be a substantially horizontal surface. In the second position, the first surface 1310 may be a substantially vertical surface.

Figure 14A:
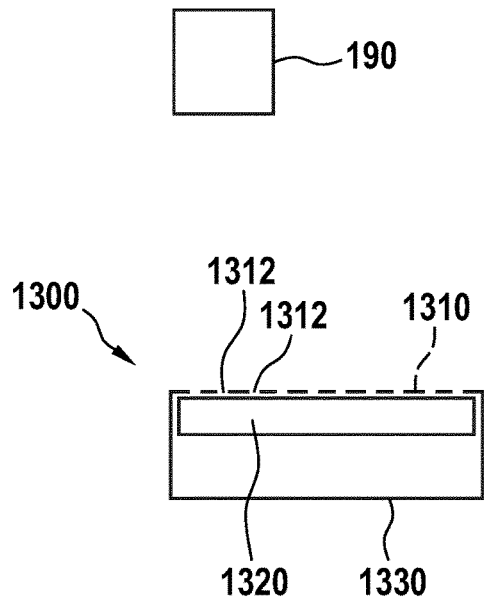
FIGS. 14a-c show a substrate support according to embodiments described herein.
Figure 14B:
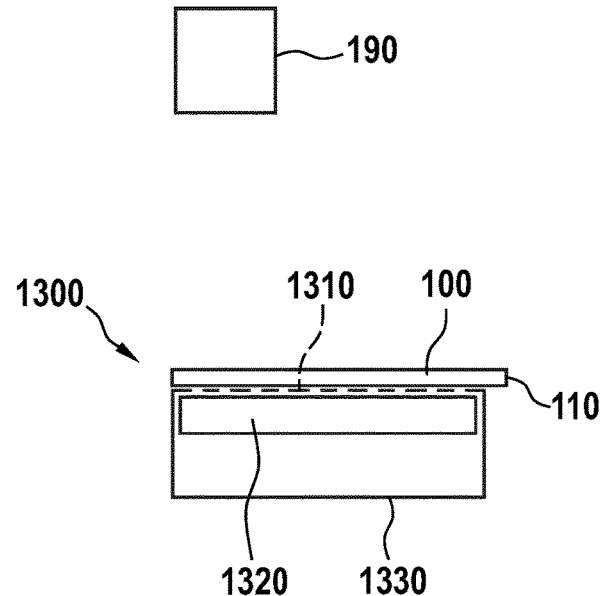
Figure 14C:
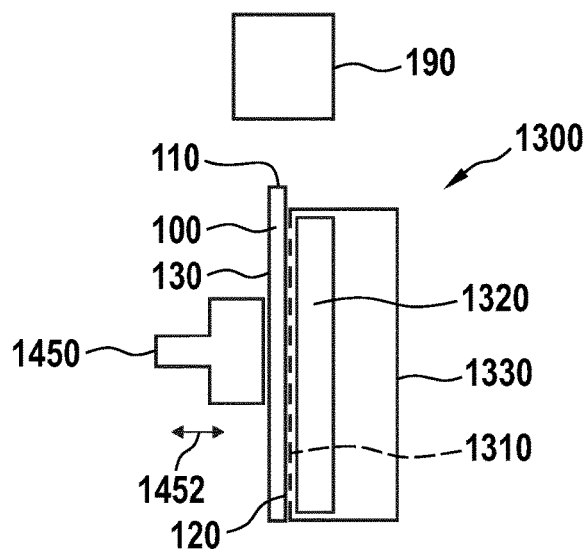

FIGS. 14*a-c* show a substrate support 1300 according to embodiments described herein. FIGS. 14*a-b* show the first surface 1310 in the first position as described herein. FIG. 14*c* shows the first surface 1310 in the second position as described herein.

As shown for example in FIGS. 14*a-b*, the substrate 100 may be loaded onto the first surface 1310 while the first surface 1310 is in the first position. As shown in FIG. 14*c*, the first surface 1310 may be moved from the first position to the second position by moving the first surface 1310 by an angle, e.g. an angle of about 90 degrees. When the first surface 1310 is in the second position, the substrate 100 is supported in a substantially vertical orientation. A first conductive pattern 250 or a first resist mask 260, as described herein, may be deposited on the side surface 110 while the first surface 1310 is in the second position.

The substrate support 1300 may include an actuator for moving the first surface 1310 from the first position to the second position. For example, the first surface 1310 may be a surface of the support member 1330, wherein the support member 1330 is movable over an angle, e.g. an angle of about 90 degrees, by the actuator.

Embodiments wherein the first surface 1310 is movable from a first position to a second position allow for receiving a horizontally oriented substrate, e.g. a substrate 100 on which in a previous stage a material was deposited while the substrate 100 was in a horizontal orientation. The substrate 100 can be received in the horizontal orientation and be rotated into a vertical orientation by the substrate support 1300, so that a material can be deposited on the side surface 110 of the substrate 100. Embodiments described herein thus facilitate switching between a horizontal orientation and a vertical orientation of the substrate 100. Particularly, where the first surface 1310 is moved between the first position and the second position by an actuator, embodiments described herein allow for switching between a horizontal orientation and a vertical orientation of the substrate 100 in a fully automated manner.

A substrate support 1300 according to embodiments described herein may include a force member 1450 for pressing the substrate 100 against the first surface 1310. FIG. 14c shows an example of a force member 1450.

For example, the force member 1450 may be a piston. The force member 1450 may be for holding the substrate 100 in the substantially vertical orientation. The force member 1450 may be configured to apply a force to the substrate, e.g. to the first main surface 120 or second main surface 130 as described herein. The force member may include a plate-like element for pressing against the substrate 100. The force member may be configured for applying a substantially horizontal force to the substrate 100. The force member 1450 may be movable in a substantially horizontal direction, as indicated by the arrow 1452 in FIG. 14c. The force member 1450 and the substrate attraction device 1320 may be arranged on opposite sides of the substrate 100.

A separator, e.g. a sheet of paper, may be arranged between the substrate 100 and the first surface 1310.

A substrate support 1300 according to embodiments described herein may be configured for supporting a stack of substrates 1010, as described herein, in a substantially vertical orientation. For example, a stack of substrates 1010 may be attracted against the first surface 1310 by the substrate attraction device 1320 and/or may be pressed against the first surface 1310 by the force member 1450.

Figure 15A:
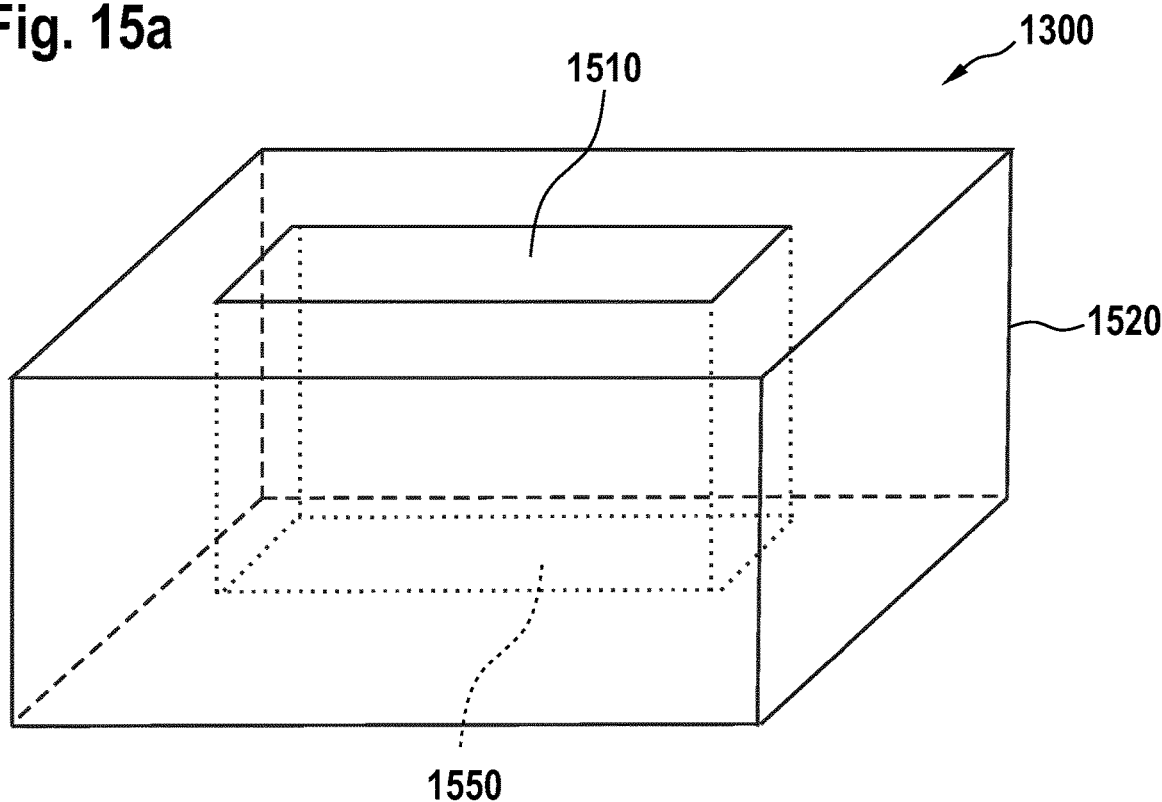
FIGS. 15a-b show a substrate support according to embodiments described herein.
Figure 15B:
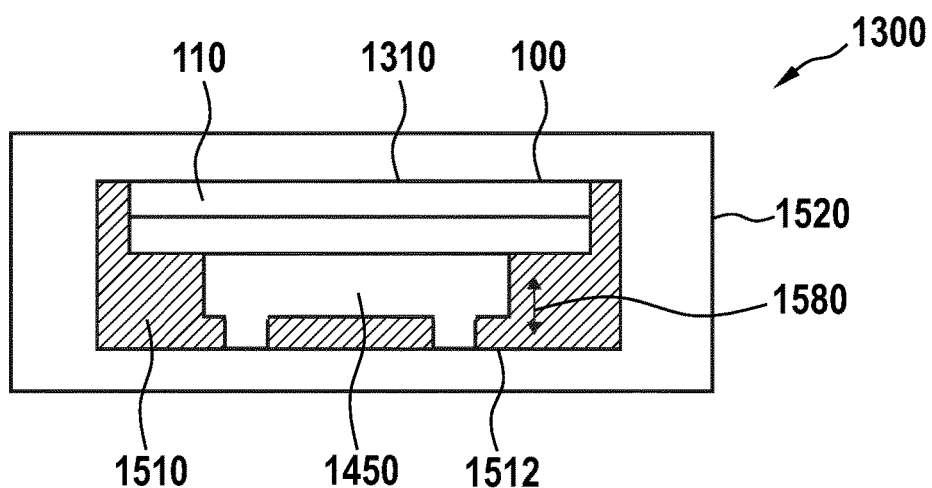

FIGS. 15a-b shows a substrate support 1300 according to embodiments described herein. FIG. 15b shows a top view.

According to a further embodiment, a substrate support 1300 for a deposition apparatus, particularly a printing apparatus, is provided. The substrate support 1300 may be for supporting a substrate 100 in a substantially vertical orientation. The substrate support 1300 includes a housing 1520 comprising a slit 1510 to receive the substrate 100 in the substantially vertical orientation. The slit 1510 may have a bottom surface. The slit 1510 may have a first surface 1310, e.g. a surface of a first side wall of the slit. The slit 1510 may have a second surface 1512, e.g. a surface of a second side wall of the slit. The second surface 1512 may face the first surface 1310. The bottom surface may connect the first surface 1310 with the second surface 1512. The first surface 1310 and the second surface 1512 may be substantially vertical surfaces. The bottom surface may be a substantially horizontal surface. The slit 1510 may be configured for receiving the substrate 100 between the first surface 1310 and the second surface 1512.

The slit 1510 may be configured for receiving the substrate 100 in a manner such that the side surface 110 of the substrate 100 is exposed for depositing a material, e.g. a first conductive pattern or a first resist mask as described herein, on the side surface 110.

The slit 1510 may have a top side. The housing 1520 may have a top side. The top side of the slit 1510 may be at the top side of the housing 1520. The top side of the slit 1510 may be an open side for receiving the substrate 100.

The slit 1510 may have a bottom side. The bottom side of the slit 1510 may be opposite the top side of the slit 1510. The slit 1510 may include a substrate supporting surface 1550 for supporting the substrate 100 from below. The substrate supporting surface 1550 may be a substantially horizontal surface. The substrate supporting surface 1550 may be at the bottom side of the slit 1510. The substrate supporting surface 1550 may be the bottom surface of the slit 1510.

The slit 1510 may be configured for receiving a stack of substrates 1010, as described herein, in a substantially vertical orientation. For example, a stack of substrates including two or three or more substrates can be inserted in the slit 1510. The substrate supporting surface 1550 may be for supporting the stack of substrates 1010 in a substantially vertical orientation. FIG. 15b shows a stack of two substrates received in the slit 1510.

The substrate support 1300 may include a force member 1450 for holding the substrate 100 in the slit 1510. FIG. 15b shows an example of a force member 1450. For example, the force member 1450 may be an arrangement including a plate pressing against the substrate 100 in the slit 1510, possibly including one or more screws for adjusting the position of the plate.

The force member 1450 may be at least partially arranged in the slit 1510. The force member 1450 may be configured to apply a force to the substrate 100, e.g. to the first main surface 120 or second main surface 130 as described herein. The force member 1450 may include a plate-like element for pressing against the substrate 100. The force member 1450 may be configured for applying a substantially horizontal force to the substrate 100. The force member 1450 may be movable in a substantially horizontal direction, as indicated by the arrow 1580 in FIG. 15b. The force member 1450 may be configured for pressing the substrate 100 against the first surface 1310 of the slit 1510. A separator, e.g. a sheet of paper, may be arranged between the substrate 100 and the first surface 1310 of the slit 1510.

The housing 1520 may surround the slit 1510. The housing 1520 may, e.g., include or be made of aluminum. The housing 1520 may be shaped as a box.

The first substrate support 180 as described herein may be a substrate support 1300 according to embodiments described herein, e.g. a substrate support 1300 as shown in FIGS. 13, 14a-c or 15a-b.

According to a further embodiment, a substrate support 1300 for supporting a substrate 100 is provided. The substrate support 1300 includes a first surface, the first surface being a stationary surface which is substantially vertical or a movable surface which is movable between a first position and a second position, wherein in the second position the first surface is substantially vertical. The substrate support 1300 includes a biasing device for biasing a substrate 100 against the first surface, the substrate 100 having a first main surface 120, a second main surface 130 opposite the first main surface 120 and a side surface 110 between the first main surface 120 and the second main surface 130. The substrate support 1300 may be configured for holding the substrate 100 in a substantially vertical orientation in a manner such that the side surface 110 of the substrate 100 is exposed for deposition of a material on the side surface 110. The first surface may be the first surface 1310 as described herein, e.g. the first surface 1310 shown in FIG. 13 or 14a-c or the first surface 1310 shown in FIG. 15b. The biasing device may include or be at least one of a substrate attraction device 1320 and a force member 1450 as described herein.

A substrate support 1300 according to embodiments described herein may be a substrate support for a deposition apparatus, particularly a printing apparatus. The substrate support may be included in the deposition apparatus. The deposition apparatus may include a deposition device, particularly a printing device. The deposition device may be for depositing a material on a substrate supported by the substrate support.

Figure 16A:
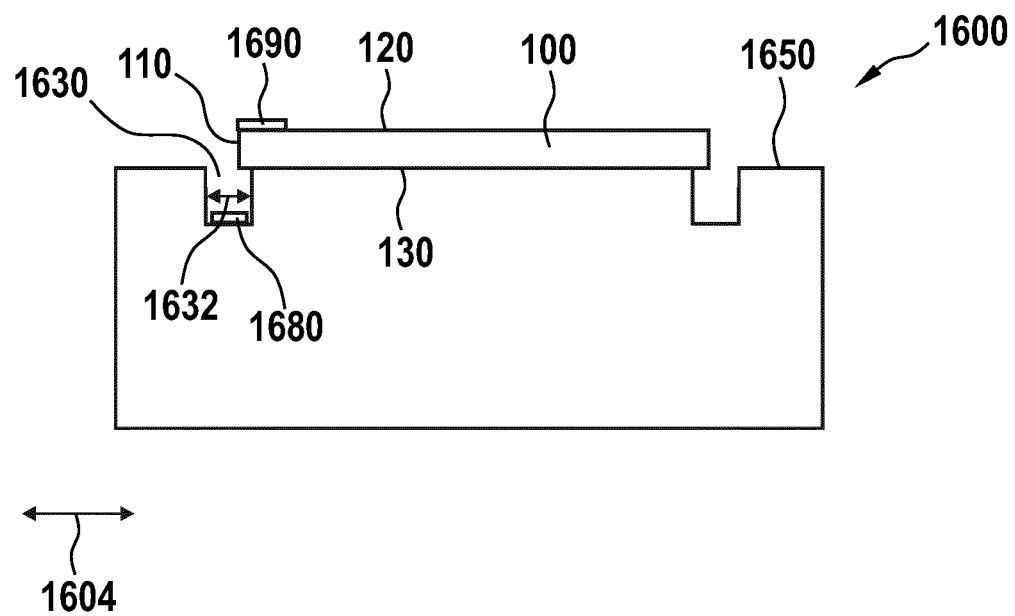
FIGS. 16a-b show a substrate support according to embodiments described herein.
Figure 16B:
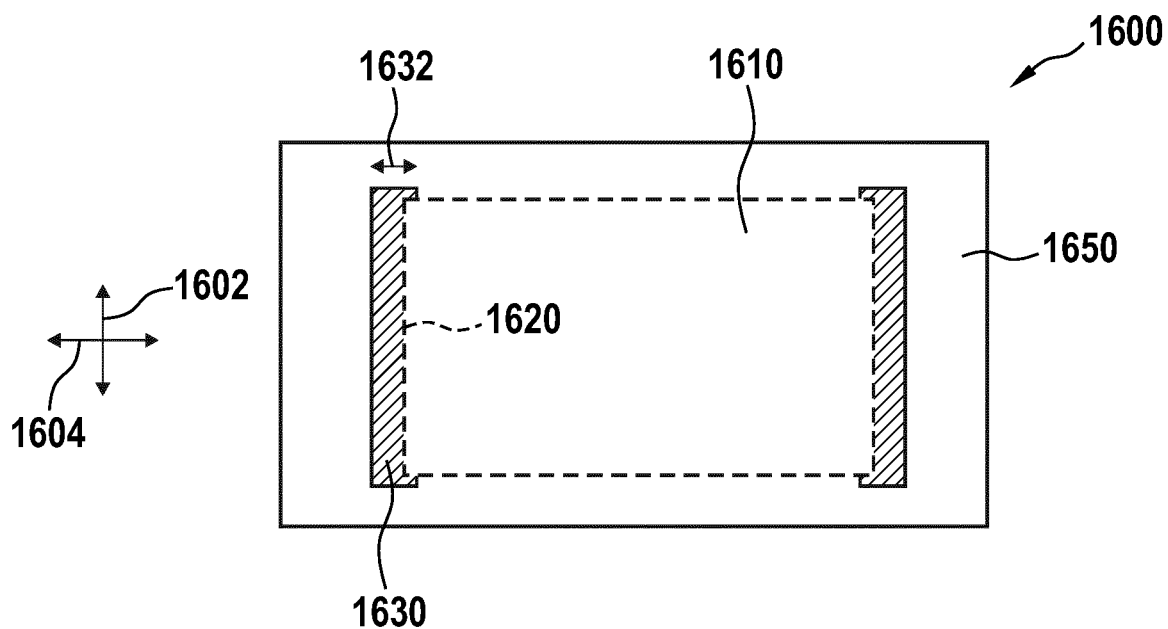

FIGS. 16a-b shows a substrate support 1600 according to embodiments described herein.

According to a further embodiment, a substrate support 1600 for supporting a substrate 100 is provided. The substrate support 1600 includes a substrate receiving area 1610. The substrate support 1600 includes a first recess 1630 at or near a first edge 1620 of the substrate receiving area 1610.

The substrate support 1600 may be a substrate support for a deposition apparatus 10, particularly a printing apparatus. The substrate support 1600 may be a nest, particularly a printing nest.

The substrate support 1600 may be configured for supporting the substrate 100 in a substantially horizontal orientation. The substrate receiving area 1610 may be a substantially horizontally oriented area. The second substrate support 320 and/or the third substrate support 360, as described herein, may be a substrate support 1600 according to embodiments described herein.

The substrate receiving area 1610 may be configured for receiving the substrate 100. The dimensions (e.g. length and width) of the substrate receiving area 1610 may correspond to the dimensions of the substrate 100 supported by the substrate support 1600. The first edge 1620 of the substrate receiving area 1610 may correspond to, e.g. be aligned with, a first edge of the substrate 100 supported in the substrate receiving area 1610.

The substrate support 1600 may have a substrate receiving surface 1650. The substrate receiving area 1610 may be a region on the substrate receiving surface 1650. The first recess 1630 may be a recess formed in the substrate receiving surface 1650.

The first edge 1620 of the substrate receiving area 1610 may have a length in a first direction, e.g. direction 1602 shown in FIG. 16b. The first recess 1630 may have a length in the first direction.

The first direction may be a horizontal direction. The first recess 1630 may be a strip-like recess having a length in the first direction. The length of the first recess 1630 in the first direction may be at least as long as, or longer than, the length of the first edge 1620 of the substrate receiving area 1610 in the first direction.

The first recess 1630 may have a width 1632 in a second direction, e.g. direction 1604 shown in FIGS. 16a-b. The width 1632 of the first recess 1630 may be smaller than the length of the first recess 1630. The second direction may be a horizontal direction. The second direction may be perpendicular to the first direction.

The first recess 1630 may have a width 1632 in the second direction from a first side of the first recess 1630 to a second side of the first recess 1630. At least a portion of the first edge 1620 of the substrate receiving area 1610 may be located between the first side and the second side of the first recess 1630.

A portion of the substrate receiving area 1610, particularly an edge portion of the substrate receiving area 1610, may overlap with the first recess 1630, as shown for example in FIG. 16b. The first side of the first recess 1630 may be outside a periphery of the substrate receiving area 1610. At least a portion of the second side of the first recess may be inside the periphery of the substrate receiving area.

The first recess 1630 may have a depth in a vertical direction.

The first recess 1630 may be configured for receiving deposition material 1680. Particularly, the first recess 1630 may be configured for receiving deposition material 1680 resulting from depositing a layer or pattern 1690 on an edge region of the substrate 100 near the first edge 1620 of the substrate receiving area 1610, such as e.g. deposition of a second/third conductive pattern or a second/third resist mask as described herein. By receiving the deposition material 1680 in the first recess 1630, the deposition material 1680 does not accumulate on the substrate receiving surface 1650 of the substrate support 1600, but is received in the first recess 1630. In light thereof, the substrate receiving surface 1650 of the substrate support 1600 does not become dirty through an accumulation of deposition material thereon. Further, the presence of the first recess 1630 allows for usage of a screen with a bigger pattern for performing screen printing on the edge region of the substrate without making the substrate support dirty, since the deposition material urged through the screen at the periphery of the screen will be received in the first recess 1630. Accordingly, an improved coverage of the edge region of the substrate 100 by the layer or pattern 1690 can be provided.

The substrate support 1600 according to embodiments described herein may include one or more further recesses like the first recess 1630. For example, the substrate receiving area 1610 may have a second edge. The substrate support 1600 may have a second recess at or near the second edge. Like the first recess 1630, the second recess may be configured to receive deposition material.

A substrate support 1600 according to embodiments described herein may be a substrate support for a deposition apparatus, particularly a printing apparatus. The substrate support may be included in the deposition apparatus. The deposition apparatus may include a deposition device, particularly a printing device. The deposition device may be for depositing a material on a substrate supported by the substrate support.

Figure 17:
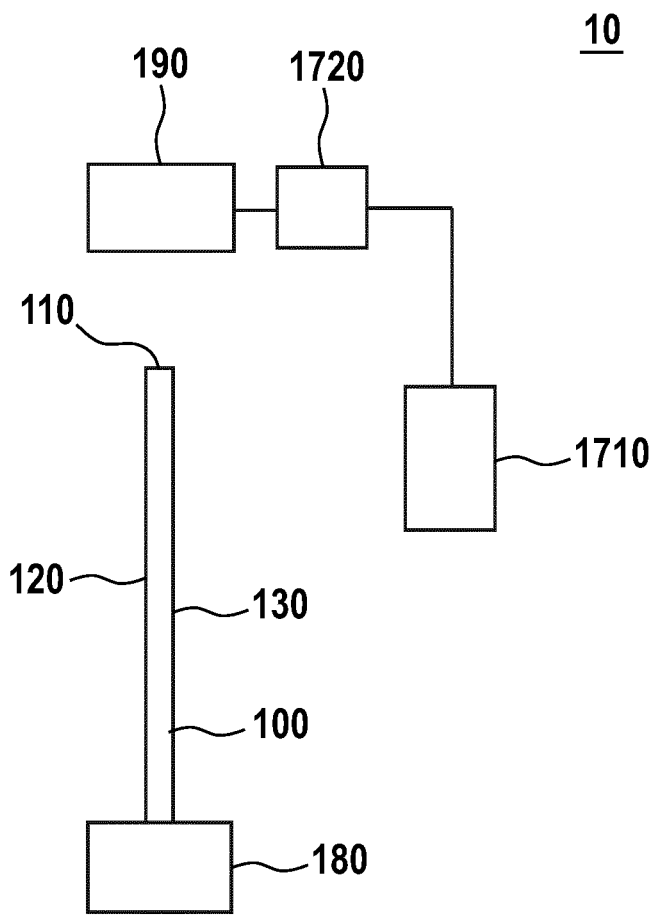
FIG. 17 shows a deposition apparatus according to embodiments described herein.

FIG. 17 shows a deposition apparatus 10 according to embodiments described herein.

According to a further embodiment, a deposition apparatus 10 is provided. The deposition apparatus 10 includes a first substrate support 180 for supporting a substrate 100. The substrate has a first main surface 120, a second main surface 130 opposite the first main surface 120 and a side surface 110 between the first main surface 120 and the second main surface 130. The deposition apparatus 10 includes a first deposition device 190. The first deposition device 190 may be for depositing a first conductive pattern 250 or a first resist mask 260 on the side surface 110 of the substrate 100. The deposition apparatus 10 includes an observation device 1710. The observation device may be for observing at least a portion of the first main surface 120. The deposition apparatus 10 includes one or more alignment actuators 1720 connected to the observation device 1710. The one or more alignment actuators 1720 may be configured to align the first deposition device 190 and the side surface 110 of the substrate 100 relative to each other.

The deposition apparatus 10 including the one or more alignment actuators 1720 may include any feature, or any feature combination, described herein within the context of other embodiments of the deposition apparatus 10. For example, the deposition apparatus 10 may include a second deposition device 330, a third deposition device 370, a first orientation-changing device, a second orientation-changing device, and so on, or any combination thereof.

The first deposition device 190 may be arranged for depositing the first conductive pattern 250 or the first resist mask 260 on the side surface 110 of the substrate 100 while the substrate 100 is supported by the first substrate support 180. The observation device 1710 may be configured for observing the at least a portion of the first main surface 120 while the substrate 100 is supported by the first substrate support 180. The one or more alignment actuators 1720 may be configured for aligning the first deposition device 190 and the side surface 110 relative to each other while the substrate 100 is supported by the first substrate support 180. The first substrate support 180 may be configured to support the substrate 100 in a substantially vertical orientation.

That the one or more alignment actuators 1720 are connected to the observation device 1710 can be understood in the sense that the observation device 1710 is in communication with the one or more alignment actuators 1720. The one or more alignment actuators 1720 may be connected to the observation device 1710 in a manner such that data obtained by observing the first main surface 120 of the substrate 100 can be provided from the observation device 1710 to the one or more alignment actuators 1720, possibly via a controller as described herein.

That the first deposition device 190 and the side surface 110 of the substrate 100 are aligned relative to each other does not necessarily mean that the entire first deposition device 190 and the side surface 110 are aligned relative to each other. For example, a portion of the first deposition device 190, such as e.g. a deposition head or printing head, may be displaced to align the portion relative to the side surface 110, while a remaining portion of the first deposition device 190 may remain stationary.

In some implementations, the one or more alignment actuators 1720 may be part of the first deposition device 190. Alternatively, the one or more alignment actuators 1720 and the first deposition device 190 may be different components of the deposition apparatus. The first deposition device 190 may be mounted to the one or more alignment actuators 1720 or vice versa. A portion of the first deposition device 190, e.g. a deposition head or printing head, may be mounted to the one or more alignment actuators 1720, or vice versa.

In some implementations, the one or more alignment actuators 1720 may be part of the first substrate support 180, e.g. a printing nest. Alternatively, the one or more alignment actuators 1720 and the first substrate support 180 may be different components of the deposition apparatus. The first substrate support 180 may be mounted to the one or more alignment actuators 1720 or vice versa.

The observation device 1710 may be configured to provide data obtained by observing at least a portion of the first main surface 120 to the one or more alignment actuators 1720. The data may be data regarding the position of the at least a portion of the first main surface 120. The one or more alignment actuators 1720 may be configured to align the first deposition device 190 and the side surface 110 of the substrate 100 relative to each other based at least on the data.

The first deposition device 190 may be configured for depositing the first conductive pattern 250 or the first resist mask 260 on the side surface 110 of the substrate 100 after the first deposition device 190 and the side surface 110 of the substrate have been aligned with respect to each other by the one or more alignment actuators 1720.

The first substrate support 180 may be configured for supporting the substrate 100 in a substantially vertical orientation. The first deposition device 190 may be configured for depositing the first conductive pattern 250 or the first resist mask 260 on the side surface 110 of the substrate 100 while the substrate 100 is supported in the substantially vertical orientation by the first substrate support 180. The observation device 1710 may be configured for observing the at least a portion of the first main surface 120 while the substrate 100 is supported in the substantially vertical orientation by the first substrate support 180.

Figure 18:
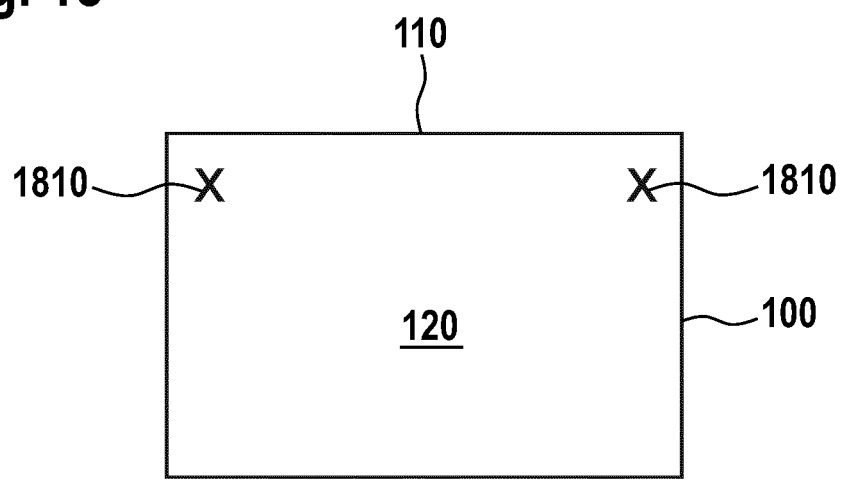
FIG. 18 shows a substrate including alignment marks.

The substrate 100 may have an alignment mark 1810 on the first main surface 120, as shown for example in FIG. 18. The observation device 1710 may be configured to observe the alignment mark 1810. The observation device 1710 may be configured to provide data obtained by observing the alignment mark 1810 to the one or more alignment actuators 1720. The data may be data regarding the position of the alignment mark 1810. The one or more alignment actuators 1720 may be configured to align the first deposition device 190 and the side surface 110 of the substrate relative to each other based at least on the data.

The first main surface 120 main include a plurality of alignment marks. For example, in the case of a rectangular substrate, an alignment mark can be provided in the two upper corners of the first main surface 120. The observation device 1710 may be configured for observing the plurality of alignment marks. The one or more alignment actuators 1720 may be configured for aligning the side surface 110 and the first deposition device 190 relative to each other at least based on data obtained by observing the plurality of alignment marks.

The alignment mark(s) on the first main surface 120 of the substrate 100 may be already available, e.g. pre-formed, for aligning the first main surface 120, e.g., for a deposition process in which a material is deposited on the first main surface 120. Embodiments described herein make use of the alignment mark(s) on the first main surface 120 to align a different surface of the substrate 100, namely the side surface 110, with respect to a deposition device for depositing a material on the side surface 110.

The observation device 1710 may be an inspection device for inspecting at least a portion of the first main surface 120 of the substrate 100. The observation device 1710 may be or include an imaging device, particularly an optical imaging device such as e.g. a camera, configured to make an image of the at least a portion of the first main surface 120. The observation device 1710 may be configured to make an image of the alignment mark 1810.

The alignment performed by the one or more alignment actuators 1720 as described herein is a relative alignment of the first deposition device 190 and the side surface 110 of the substrate 100 with respect to each other. The one or more alignment actuators 1720 may be configured for moving the first deposition device 190 (as illustrated e.g. in FIG. 17), for moving the substrate 100 or for moving both the first deposition device 190 and the substrate 100 to align the first deposition device 190 and the side surface 110 of the substrate relative to each other.

The one or more alignment actuators 1720 may be configured for providing a translational alignment and/or an angular alignment of the first deposition device 190 and the side surface 110 of the substrate relative to each other.

The one or more alignment actuators 1720 may be configured for translating the first deposition device 190, or at least a portion thereof, such as e.g. a deposition head or printing head of the first deposition device 190. The first deposition device 190 or the portion thereof may be moved, e.g. translated, by the one or more alignment actuators 1720 in a substantially vertical direction and/or in a substantially horizontal direction. Additionally or alternatively, the one or more alignment actuators 1720 may be configured for changing an angle of the first deposition device 190, or at least a portion thereof, such as a deposition head or printing head. The angle may be an angle with respect to a substantially horizontal axis.

The one or more alignment actuators 1720 may be configured for translating the substrate 100. The substrate 100 may be translated in a substantially vertical direction and/or in a substantially horizontal direction. The one or more alignment actuators 1720 may be configured for changing an angle of the substrate 100. The angle may be an angle with respect to a substantially horizontal axis.

A deposition apparatus 10 according to embodiments described herein may include a controller. The controller may be connected to the observation device 1710. Additionally or alternatively, the controller may be connected to the one or more alignment actuators 1720. The controller may be configured to determine a target relative position for the first deposition device 190 with respect to the side surface 110 of the substrate 100 based on data provided by the observation device 1710. The data may be data regarding the position of the at least a portion of the first main surface 120 or data regarding the position of the alignment mark 1810. The controller may be configured for issuing an instruction to the one or more alignment actuators 1720. The controller may be configured to instruct the one or more alignment actuators to move the first deposition device 190, or a portion thereof, and/or to move the substrate 100, to provide the first deposition device 190 and the substrate 100 in the target relative position. In the target relative position, the first deposition device 190 and the substrate 100 are well-aligned relative to each other.

Figure 19:
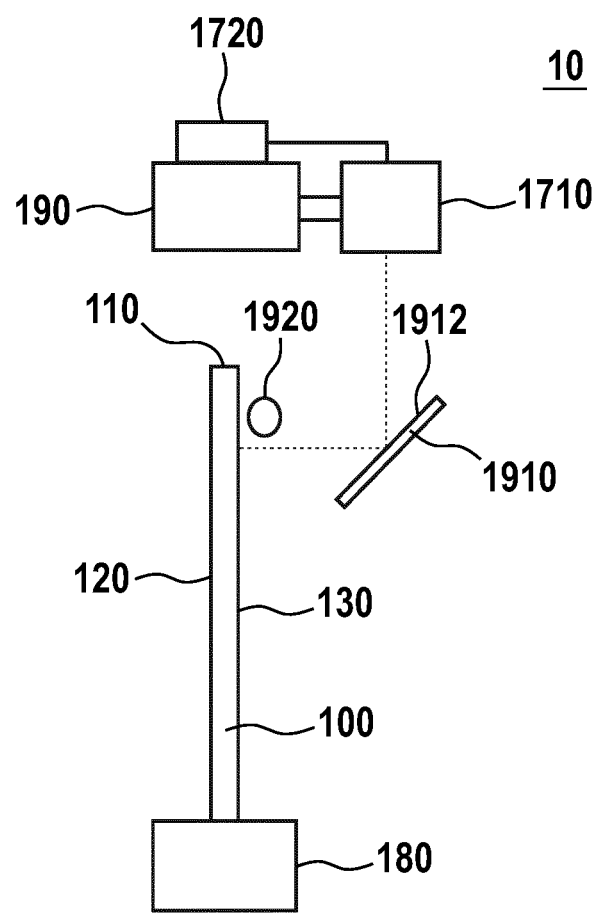
FIG. 19 shows a deposition apparatus according to embodiments described herein.

FIG. 19 shows a deposition apparatus 10 according to embodiments described herein.

The observation device 1710, e.g. a camera, may be connected to the first deposition device 190. The observation device may be mounted to the first deposition device 190, as shown for example in FIG. 19. For example, the observation device 1710 may be connected or mounted to a deposition head, e.g. a printing head, of the first deposition device 190.

A deposition apparatus according to embodiments described herein may include a reflective surface 1912. The reflective surface 1912 may be a reflective surface of a reflective member 1910, e.g. a mirror. The observation device 1710, e.g. a camera, may be configured for observing at least a portion of the first main surface 120 via the reflective surface 1912. The observation device 1710 may be arranged at an elevated position with respect to the reflective surface 1912. For example, the observation device 1710 may be attached or mounted to the first deposition device 190, particularly to a printing head of the first deposition device 190. The reflective surface 1912 may face the substrate 100 supported by the first substrate support 180. In particular, the reflective surface 1912 may face the vertically oriented substrate 100. The reflective surface 1912 may be arranged to reflect light emanating from a region near the first main surface 120 to the observation device 1710, as e.g. indicated in FIG. 19 by the dashed lines.

A deposition apparatus according to embodiments described herein may include a light source 1920. The light source 1920 may be for illuminating the first main surface 120. The light source 1920 may be arranged in a region near a substrate receiving area of the first substrate support 180 or near the substrate 100 supported by the first substrate support 180. The light source 1920 and the reflective surface 1912 may be arranged on the same side of the substrate 100 or substrate receiving area (as shown e.g. in FIG. 19), or on different sides of the substrate 100 or substrate receiving area (e.g. if the substrate 100 is transparent). Light from the light source 1920 may travel to the reflective surface 1912 and be reflected by the reflective surface to the observation device. The observation device 1710 may be configured for observing at least a portion of the first main surface 120 via the reflective surface 1912.

Whereas some embodiments described herein use a light source 1920 and a reflective surface 1912 to facilitate the observation of the substrate 100 by the observation device 1710, neither the light source 1920 nor the reflective surface 1912 is necessary for observing the substrate 100. For example, the observation device 1710 may be arranged to face the substrate 100 supported by the first substrate support 180. In such a set-up, a reflective surface 1912 is not needed. Further, depending on the lighting conditions of the deposition apparatus 10, a light source 1920 for illuminating the first main surface 120 may not be necessary.

In the above description of the deposition apparatus 10, the observation device 1710 is arranged for observing at least a portion of the first main surface 120, as shown for example in FIG. 17. Alternatively, the observation device 1710 can be arranged for observing at least a portion of the second main surface 130.

Figure 20A:
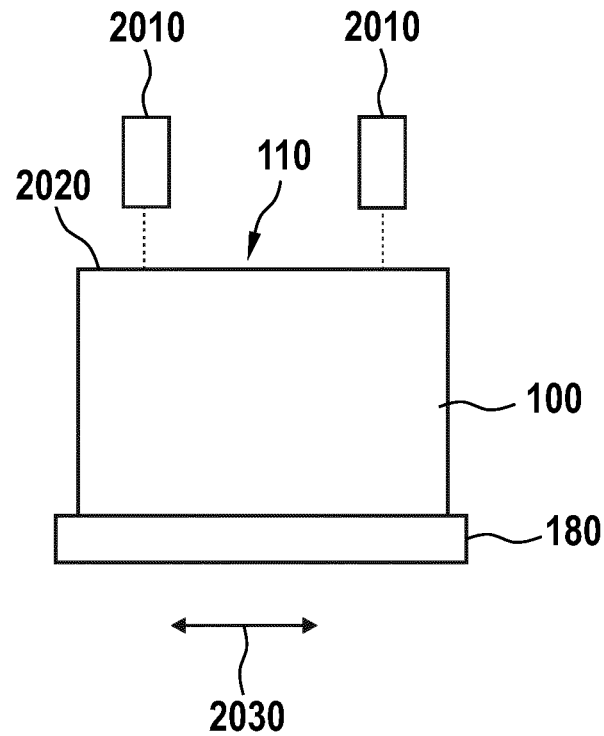
FIGS. 20a-b shows a deposition apparatus according to embodiments described herein.
Figure 20B:
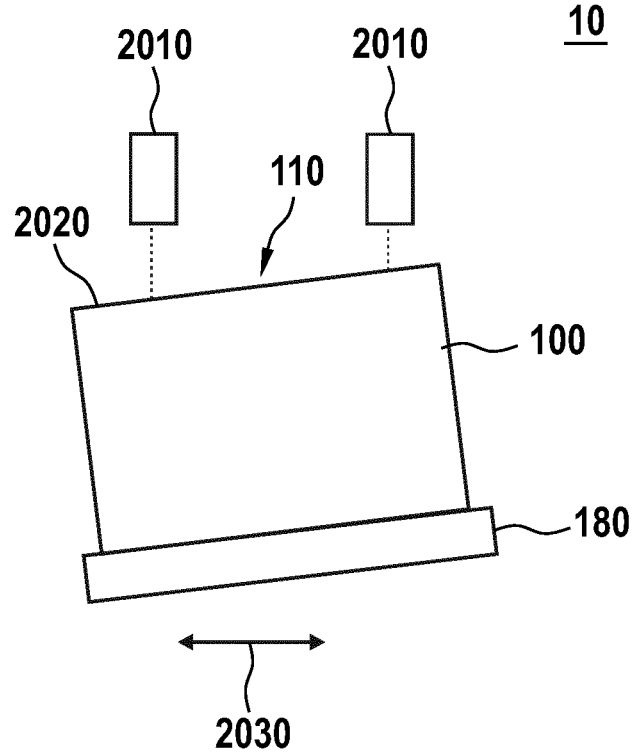

FIGS. 20*a-b* show a deposition apparatus 10 according to embodiments described herein.

A deposition apparatus 10 according to embodiments described herein may include one or more inspection units 2010 for determining an alignment of the side surface 110 with respect to a substantially horizontal direction, e.g. direction 2030 shown in FIGS. 20*a-b*. The one or more inspection units 2010 can be combined with any embodiment of a deposition apparatus 10 as described herein.

The one or more inspection units 2010 may be arranged above a substrate receiving area of the first substrate support 180 or above the substrate 100 supported by the first substrate support 180, particularly a vertically oriented substrate or substrate receiving area. The one or more inspection units 2010 may be two or more inspection units, e.g. two cameras or distance sensors. The two or more inspection units may include a first inspection unit and a second inspection unit spaced apart from each other by a horizontal distance, as shown for example in FIGS. 20*a-b*.

The one or more inspection units 2010 may be configured to inspect the side surface 110 of the substrate 100 supported by the first substrate support 180. The one or more inspection units 2010 may be configured to inspect an upper edge 2020 of the substrate 100 supported by the first substrate support 180. The upper edge 2020 may be an edge of the side surface 110. The upper edge 2020 may be a substantially horizontal edge of the substrate 100 supported by the first substrate support 180.

The one or more inspection units 2010 may be part of the observation device 1710 as described herein, may be the observation device 1710, or may be separate from the observation device 1710.

The one or more inspection units 2010 may be configured for determining a height of the substrate 100, particularly a vertically oriented substrate, supported by the first substrate support 180. In light thereof, embodiments described herein allow for dynamically changing the snap-off according to the height of the substrate 100 and the difference of substrate size can be compensated for on a substrate-by-substrate basis.

Additionally or alternatively, the one or more inspection units may be for determining a horizontal alignment of the upper edge 2020, particularly for determining whether the upper edge 2020 is aligned with a substantially horizontal direction, e.g. direction 2030 shown in FIGS. 20a-b. The one or more inspection units may be for determining whether an angle exists between the upper edge 2020 and the substantially horizontal direction. If no angle or an angle below a small threshold angle exists, the upper edge 2020 may be well aligned, as shown for example in FIG. 20a. If an angle above the threshold value exists, the upper edge 2020 may not be well aligned, as shown for example in FIG. 20b. The angle between the upper edge 2020 and the direction 2030 is drawn in an exaggerated manner in FIG. 20b.

By having the one or more inspection units 2010, embodiments described herein provide the advantage that the deposition process, e.g. a screen printing process, can be interrupted or stopped if the tilting angle of the substrate 100, i.e. the angle between the upper edge 2020 and the substantially horizontal direction 2030, is too large. In light thereof, damage to e.g. the screen of the first deposition device, which can arise if the tilting angle of the substrate is too large, can be avoided.

According to a further embodiment, a method of alignment is provided. The method includes providing a substrate 100 having a first main surface 120, a second main surface 130 opposite the first main surface 120 and a side surface 110 between the first main surface 120 and the second main surface 130. The method includes aligning a first deposition device 190 and the side surface 110 of the substrate relative to each other, the aligning being based at least on data obtained by observing at least a portion of the first main surface 120.

The aligning of the first deposition device 190 and the side surface 110 relative to each other may be performed by one or more alignment actuators 1720 as described herein.

The method may include depositing a first conductive pattern 250 or a first resist mask 260, as described herein, on the side surface 110 of the substrate 100 using the first deposition device 190. The first conductive pattern 250 or the first resist mask 260 may be deposited on the side surface 110 after the first deposition device 190 and the side surface 110 of the substrate have been aligned with respect to each other based on the data obtained by observing the first main surface 120.

The method may include supporting the substrate 100 in a substantially vertical orientation, e.g. using a first substrate support 180 as described herein. The method may include observing the at least a portion of the first main surface 120 while the substrate 100 is supported in the substantially vertical orientation. The first deposition device 190 and the side surface 110 of the substrate 100 may be aligned relative to each other while the substrate 100 is supported in the substantially vertical orientation. The first conductive pattern 250 or the first resist mask 260 may be deposited on the side surface 110 of the substrate 100 while the substrate 100 is supported in the substantially vertical orientation.

The substrate 100 may have an alignment mark 1810, as described herein, on the first main surface 120. Particularly, the at least a portion of the first main surface 120 may include the alignment mark 1810. The method may include observing the alignment mark 1810, particularly observing a position of the alignment mark 1810. The data obtained by observing at least a portion of the first main surface 120 may be data obtained by observing the alignment mark 1810. The method may include aligning the first deposition device 190 and the side surface 110 of the substrate relative to each other based at least on the data obtained by observing the alignment mark 1810.

Observing at least a portion of the first main surface 120 or observing the alignment mark 1810 may include making one or more images of the at least a portion or of the alignment mark 1810, e.g. using a camera.

The method may include determining an alignment of the side surface 110 with respect to a substantially horizontal direction, as described herein. The alignment may be determined using one or more inspection units 2010 as described herein.

While the foregoing is directed to embodiments of the disclosure, other and further embodiments of the disclosure may be devised without departing from the basic scope thereof, and the scope thereof is determined by the claims that follow.

The invention claimed is:

1. A deposition apparatus, comprising:
   a first substrate support for supporting a substrate in a substantially vertical orientation, the substrate having a first main surface, a second main surface opposite the first main surface and a side surface between the first main surface and the second main surface; and
   a first deposition device for depositing a first conductive pattern or a first resist mask on the side surface of the substrate while the substrate is supported in the substantially vertical orientation by the first substrate support.

2. The deposition apparatus according to claim 1,
   wherein the first substrate support is configured for supporting a stack of substrates in a substantially vertical orientation, the stack of substrates in the substantially vertical orientation having a top portion,
   wherein the first deposition device is configured for depositing a conductive pattern or a resist mask on the top portion of the stack while the stack is supported in the substantially vertical orientation by the first substrate support.

3. A method of deposition on a substrate, comprising:
   providing a substrate in a substantially vertical orientation, the substrate having a first main surface, a second main surface opposite the first main surface and a side surface between the first main surface and the second main surface, the side surface being a surface at a top portion of the substrate and having a width corresponding to a thickness of the substrate; and
   printing a first conductive pattern or a first resist mask on the side surface of the substrate while the substrate is in the substantially vertical orientation.

4. The method according to claim 3, further comprising at least one of:
   depositing a second conductive pattern or a second resist mask on the first main surface, wherein a portion of the second conductive pattern contacts a portion of the first conductive pattern or a portion of the second resist mask contacts a portion of the first resist mask; and
   depositing a third conductive pattern or a third resist mask on the second main surface, wherein a portion of the third conductive pattern contacts a portion of the first conductive pattern or a portion of the third resist mask contacts a portion of the first resist mask.

5. The method according to claim 4, wherein:
   the first conductive pattern includes a first plurality of conductive lines, the second conductive pattern includes a second plurality of conductive lines, and the third conductive pattern includes a third plurality of conductive lines, each conductive line of the first plurality of conductive lines contacting a conductive line of the second plurality of conductive lines and a conductive line of the third plurality of conductive lines to form an electrical connection from the first main surface to the second main surface, or the first resist mask includes a first plurality of line-like openings, the second resist mask includes a second plurality of line-like openings, and the third resist mask includes a third plurality of line-like openings, each line-like opening of the first plurality of line-like openings being adjacent to a line-like opening of the second plurality of line-like openings and to a line-like opening of the third plurality of line-like openings.

6. The method of claim 3, wherein the substrate is provided in the substantially vertical orientation by a first substrate support and the first conductive pattern or the first resist mask is deposited on the side surface of the substrate by a first deposition device, the method further comprising:

supporting the substrate in a substantially horizontal orientation by a second substrate support; and depositing a second conductive pattern or a second resist mask on the first main surface of the substrate by a second deposition device while the substrate is supported by the second substrate support.

7. The method of claim 6, further comprising:

supporting the substrate in a substantially horizontal orientation by a third substrate support; and depositing a third conductive pattern or a third resist mask on the second main surface of the substrate by a third deposition device while the substrate is supported by the third substrate support.

8. The method of claim 3, further comprising:

changing the orientation of the substrate from a first orientation of the substrate to a second orientation of the substrate.

9. The method of claim 3, further comprising:

supporting a stack of substrates in a substantially vertical orientation, the stack of substrates including the substrate, the stack of substrates in the substantially vertical orientation having a top portion; and depositing a conductive pattern or a resist mask on the top portion of the stack while the stack is supported in the substantially vertical orientation.

* * * * *